(12) United States Patent
Kitagawa et al.

(10) Patent No.: US 8,937,832 B2
(45) Date of Patent: Jan. 20, 2015

(54) MAGNETIC MEMORY

(71) Applicant: Kabushiki Kaisha Toshiba, Tokyo (JP)

(72) Inventors: Eiji Kitagawa, Yokohama (JP); Daisuke Saida, Tokyo (JP); Naoharu Shimomura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 303 days.

(21) Appl. No.: 13/621,969

(22) Filed: Sep. 18, 2012

(65) Prior Publication Data
US 2013/0250665 A1    Sep. 26, 2013

(30) Foreign Application Priority Data

Mar. 21, 2012    (JP) .................................. 2012-063478

(51) Int. Cl.
*G11C 11/00*    (2006.01)
(52) U.S. Cl.
USPC ...................................... 365/158; 365/171 G
(58) Field of Classification Search
USPC .......................................... 365/158, 171, 173
See application file for complete search history.

(56) References Cited

U.S. PATENT DOCUMENTS

| | | | |
|---|---|---|---|
| 6,532,164 B2 | 3/2003 | Redon et al. | |
| 6,853,580 B2 * | 2/2005 | Nishimura | 365/158 |
| 8,508,985 B2 * | 8/2013 | Ito | 365/158 |
| 2002/0167059 A1 * | 11/2002 | Nishimura et al. | 257/421 |
| 2011/0063899 A1 | 3/2011 | Ogimoto | |

FOREIGN PATENT DOCUMENTS

| | | |
|---|---|---|
| JP | 2003-142753 | 5/2003 |
| JP | 2008-28362 | 2/2008 |
| WO | WO 2009/098796 A1 | 8/2009 |

OTHER PUBLICATIONS

Japanese Office Action issued Oct. 15, 2013, in Japan Patent Application No. 2012-063478 (with English translation).

* cited by examiner

*Primary Examiner* — Vu Le
(74) *Attorney, Agent, or Firm* — Oblon, Spivak, McClelland, Maier & Neustadt, L.L.P.

(57) ABSTRACT

According to one embodiment, a magnetic memory includes a magnetoresistive element. The element includes a first magnetic film having a variable magnetization perpendicular to a film surface, a second magnetic film having an invariable magnetization perpendicular to the film surface, a nonmagnetic film between the first and second magnetic films, a magnetic field application layer including a third magnetic film having a magnetization parallel to the film surface. The third magnetic film applies a magnetic field parallel to the film surface to the first magnetic film. A magnitude of the magnetization of the third magnetic film when supplying a read current is larger than a magnitude of the magnetization of the third magnetic film when supplying a write current.

18 Claims, 11 Drawing Sheets

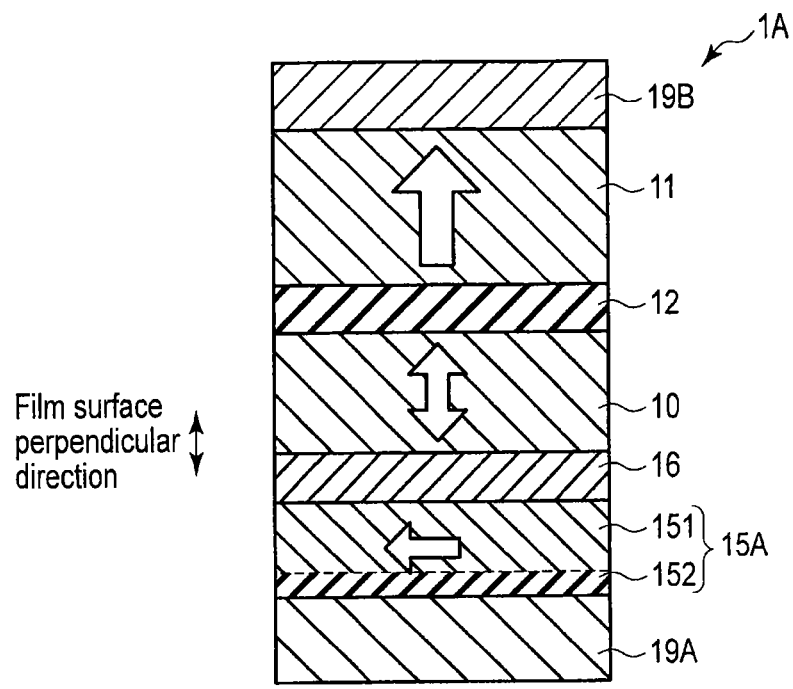
F I G. 4
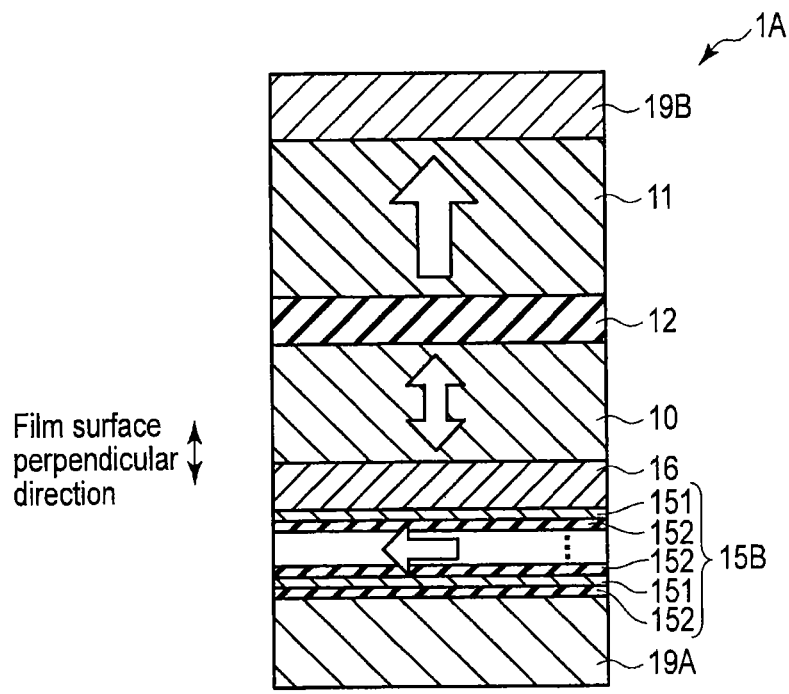
F I G. 5

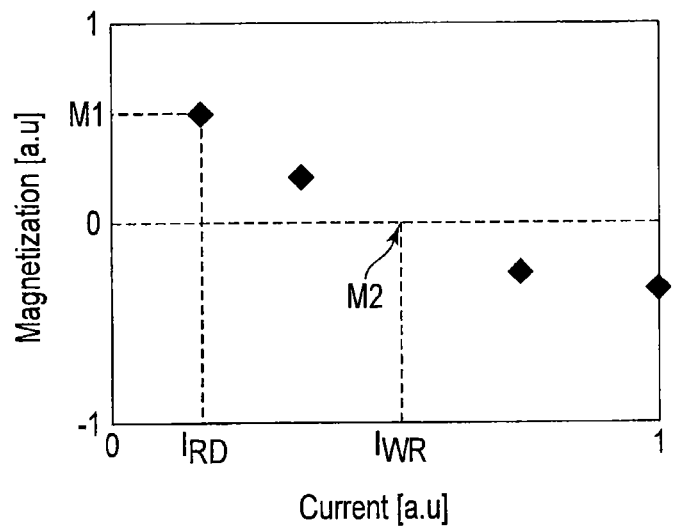
F I G. 6
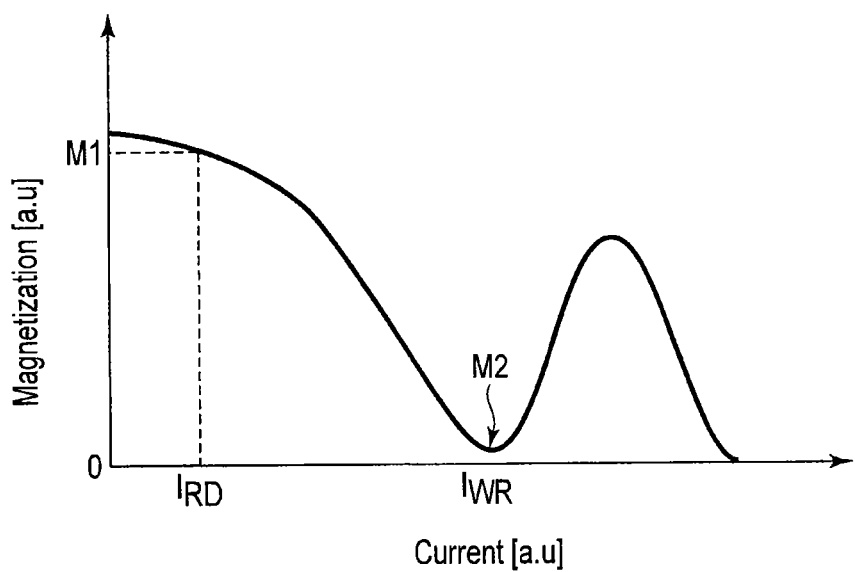
F I G. 7

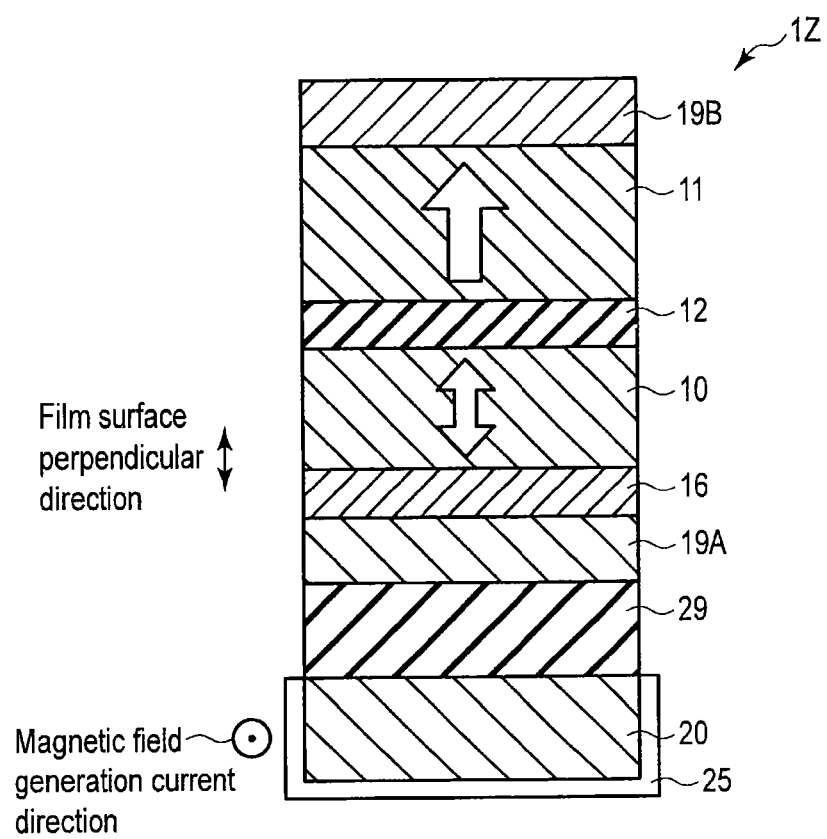
F I G. 9

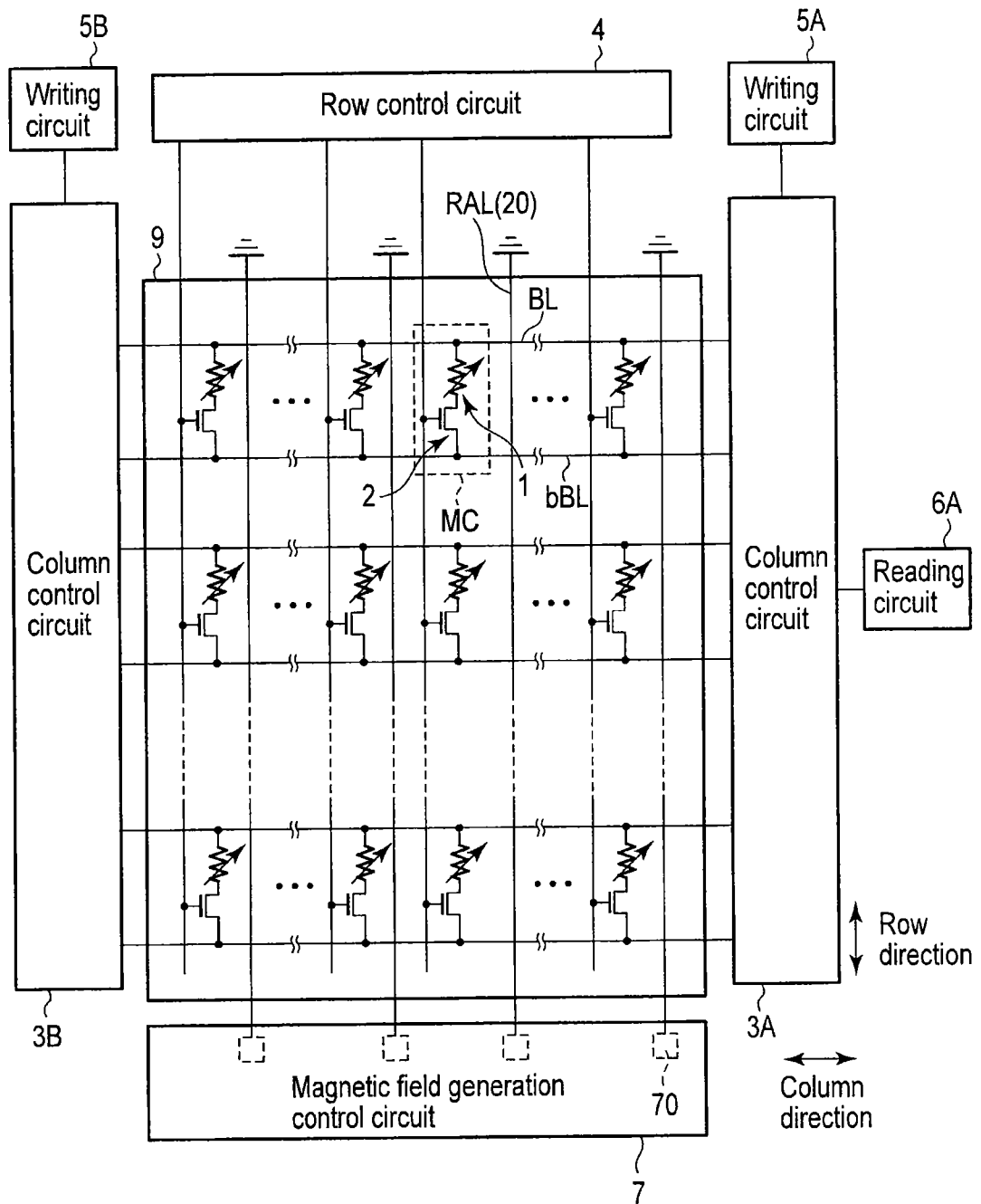
F I G. 14

US 8,937,832 B2

MAGNETIC MEMORY

CROSS-REFERENCE TO RELATED APPLICATIONS

This application is based upon and claims the benefit of priority from Japanese Patent Application No. 2012-063478, filed Mar. 21, 2012, the entire contents of which are incorporated herein by reference.

FIELD

Embodiments described herein relate generally to a magnetic memory.

BACKGROUND

There have been proposed various techniques to implement a magnetic memory using a TMR (Tunnel Magneto Resistive) element.

In one method, "1" or "0" data is recorded in an MTJ (Magnetic Tunnel Junction) element in correspondence with its magnetization alignment state, and the data is read based on the difference in the resistance value of the element by the TMR effect.

As a method of writing data in a magnetic memory, that is, reversing the magnetization of the magnetic film of an MTJ element, a magnetization reversing method (to be referred to as spin transfer torque hereinafter) of flowing a spin-polarized current to an MTJ element has received a great deal of attention from the viewpoint of reducing the element size and the current value.

A magnetic memory (for example, MRAM) of the spin transfer torque method has been developed as a memory capable of reducing power consumption and increasing the speed and capacity.

BRIEF DESCRIPTION OF THE DRAWINGS

FIGS. 4, 5, and 6 are views for explaining Arrangement Example 1 of the magnetoresistive element according to the first embodiment;

FIG. 7 is a graph showing Arrangement Example 2 of the magnetoresistive element according to the first embodiment;

FIGS. 8, 9, 10, and 11 are views for explaining a magnetoresistive element according to the second embodiment;

FIGS. 14 and 15 are views showing an application example of the magnetoresistive element according to the second embodiment.

DETAILED DESCRIPTION

Embodiments

Figure 1:
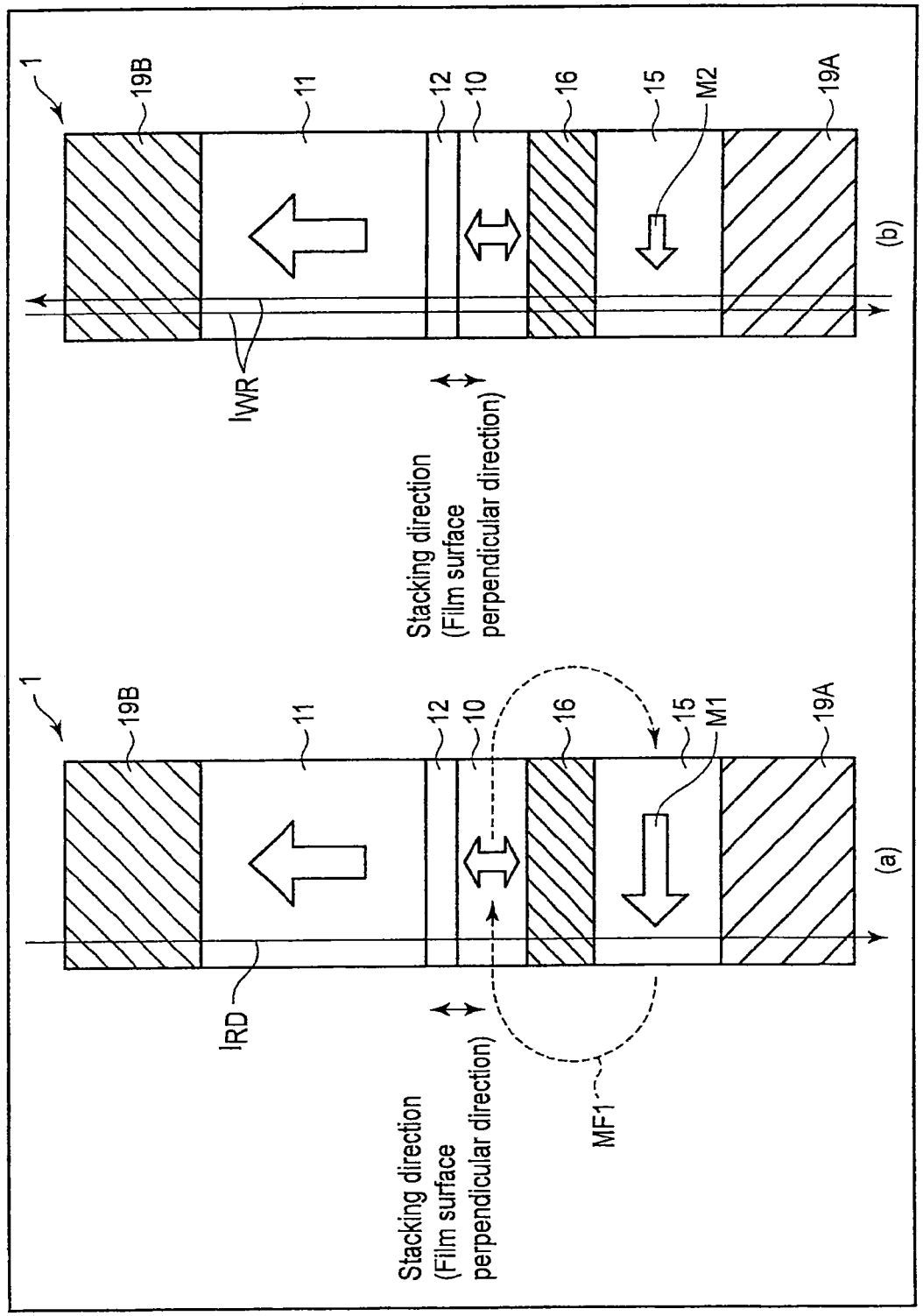
FIGS. 1, 2, and 3 are views for explaining a magnetoresistive element according to the first embodiment.

The embodiments will now be described in detail with reference to the accompanying drawings. In the following description, the same reference numerals denote elements having the same functions and arrangements, and a repetitive description thereof will be done as needed.

In general, according to one embodiment, a magnetic memory includes a memory cell including a magnetoresistive element, the magnetoresistive element comprising a first magnetic film having a magnetization perpendicular to a film surface and a variable magnetization direction, a second magnetic film having a magnetization perpendicular to the film surface and an invariable magnetization direction, a first nonmagnetic film between the first magnetic film and the second magnetic film, a magnetic field application layer including a third magnetic film provided on the first magnetic film opposite to a side of the first nonmagnetic film, the third magnetic film having a magnetization parallel to the film surface and applying a magnetic field to the first magnetic film, the magnetic field being parallel to the film surface of the first magnetic film; and an intermediate layer provided between the first magnetic film and the magnetic field application layer; a writing circuit supplying a write current to the memory cell to write data to the memory cell, the write current flowing into the first magnetic film, the second magnetic film and the magnetic field application layer; a reading circuit supplying a read current to the memory cell to read data stored in the memory cell, the read current flowing into the first magnetic film, the second magnetic film and the magnetic field application layer, a magnitude of the read current less than a magnitude of the write current. A magnitude of the magnetization of the third magnetic film when the read current flows into the magnetic field application layer is larger than the magnitude of the magnetization of the third magnetic film when the write current flows into the magnetic field application layer.

(1) First Embodiment

A magnetoresistive element according to the first embodiment will be described with reference to FIGS. 1, 2, 3, 4, 5, 6, and 7.

(a) Basic Example

A basic example of the magnetoresistive element according to the first embodiment will be described with reference to FIGS. 1A, 1B, 2, and 3.

FIG. 1 is schematic sectional views for explaining the structure and operation mechanism of a magnetoresistive element 1 according to this embodiment.

As shown in (a) and (b) of FIG. 1, the magnetoresistive element 1 of this embodiment includes two magnetic films 10 and 11 between two electrodes 19A and 19B of the element 1.

The two magnetic films 10 and 11 have a magnetic anisotropy in a direction perpendicular to their film surfaces. The magnetizations of the two magnetic films 10 and 11 are perpendicular to their film surfaces. A magnetic film (magnetic material or magnetic layer) whose magnetization is perpendicular to the film surface will also be referred to as a perpendicular magnetization film hereinafter.

Out of the two magnetic films 10 and 11, one magnetic film 10 has a variable magnetization direction. The magnetization direction of the other magnetic film 11 is invariable (fixed). The magnetic film 10 having a variable magnetization direction will be referred to as the storage layer 10 (also called a recording layer, a free layer, or a variable magnetization layer) hereinafter. The magnetic film 11 having an invariable (fixed) magnetization direction will be referred to as the reference layer 11 (also called an invariable magnetization layer) hereinafter.

The magnetizations of the storage layer 10 and the reference layer 11 are formed by aggregates of a plurality of spins in the storage layer 10 and the reference layer 11.

The magnetization of the storage layer 10 is reversible. The reference layer 11 has a magnetization reversal threshold larger than that of the storage layer 10. The magnetization direction of the reference layer 11 is actually fixed. Considering data write using the spin transfer torque method, the storage layer 10 is preferably formed using a material having a small damping constant.

A nonmagnetic film 12 is provided between the two magnetic films (storage layer and reference layer) 10 and 11. A magnetic tunnel junction is formed by the two magnetic films 10 and 11 and the nonmagnetic film 12 between them. The storage layer 10, the nonmagnetic film 12, and the reference layer 11 are stacked on a substrate (not shown). The stack structure that forms the magnetic tunnel junction is sandwiched between the two electrodes 19A and 19B in the stacking direction.

An underlying layer (to be also referred to as an intermediate layer hereinafter) 16 is provided between the storage layer 10 and the electrode (to be referred to as a lower electrode hereinafter) 19A on the substrate side where the magnetoresistive element 1 is provided. The underlying layer 16 is provided on a side of the storage layer 10 opposite to the side of the storage layer 10 where the nonmagnetic film 12 is provided. The underlying layer 16 is in contact with the storage layer 10. The underlying layer 16 reduces spin pumping between the storage layer 10 and the underlying layer 16 and lowers the damping constant of the storage layer 10. Providing the underlying layer 16 allows to reduce the damping constant of the storage layer 10, thereby contributing to reduction of the current for magnetization reversal of the storage layer 10.

The electrode (to be referred to as an upper electrode hereinafter) 19B is provided on the reference layer 11 on a side opposite to the substrate side where the magnetoresistive element 1 is provided. The reference layer 11 is provided between the nonmagnetic film 12 and the upper electrode 19B.

As shown in FIG. 1, in this embodiment, a magnetic film 15 different from the storage layer 10 and the reference layer 11 is provided between the underlying layer 16 and the lower electrode 19A. The magnetic film 15 has a magnetic anisotropy parallel to the film surface. Magnetizations M1 and M2 of the magnetic film 15 are parallel to the film surface. The magnetic film having a magnetization parallel to the film surface will also be referred to as an in-plane magnetic film hereinafter. For example, the magnetization direction of the magnetic film 15 that is an in-plane magnetic film is invariable (fixed).

In the MTJ element 1 according to this embodiment, the relative magnetization directions of the storage layer 10 and the reference layer 11 are reversed by, for example, spin transfer torque (to be referred to as STT hereinafter).

An operation of reversing the magnetization of the storage layer 10 of the MTJ element 1 according to this embodiment by STT will be described with reference to (b) of FIG. 1.

The magnetization direction of the storage layer 10 of the MTJ element 1 is changed by the spin torque caused by a current $I_{WR}$ supplied to the MTJ element 1. That is, the magnetization direction of the storage layer 10 changes when spin-polarized electrons included in the write current $I_{WR}$ act on the magnetization (spin) of the storage layer 10.

"The magnetization direction of the reference layer is fixed" or "the magnetization direction of the reference layer is invariable" means that the magnetization direction of the reference layer 11 does not change when a current (to be referred to as a write current hereinafter) equal to or more than the magnetization reversal threshold for reversing the magnetization direction of the storage layer 10 flows to the reference layer 11.

Hence, in the MTJ element 1, a magnetic film having a large magnetization reversal threshold is used as the reference layer 11, and a magnetic film having a magnetization reversal threshold smaller than that of the reference layer 11 is used as the storage layer 10. The MTJ element 1 including the storage layer 10 having a variable magnetization direction and the reference layer 11 having a fixed magnetization direction is thus formed.

The write current $I_{WR}$ has a current value larger than the magnetization reversal threshold of the storage layer 10 and smaller than the magnetization reversal threshold of the reference layer 11.

When the magnetization direction of the storage layer 10 is parallel (P) to that of the reference layer 11, that is, the magnetization direction of the storage layer 10 is the same as that of the reference layer 11, the current $I_{WR}$ flowing from the storage layer 10 to the reference layer 11 is supplied to the MTJ element 1.

In this case, the electrons move from the reference layer 11 to the storage layer 10 via the nonmagnetic film 12. Out of the electrons that have moved to the storage layer 10 via the reference layer 11 and the nonmagnetic film 12, the majority of electrons (spin-polarized electrons) have the same direction as the magnetization (spin) direction of the reference layer 11. The spin momentum transfer (spin torque) of the spin-polarized electrons is applied to the magnetization (spin) of the storage layer 10, and the magnetization of the storage layer 10 changes to the same direction as the magnetization direction of the reference layer 11. When the magnetization alignment of the MTJ element 1 is parallel alignment (parallel state), the resistance value of the MTJ element 1 is minimized.

When the magnetization direction of the storage layer 10 is antiparallel (AP) to the magnetization direction of the reference layer 11, that is, the magnetization direction of the storage layer 10 is reverse that of the reference layer 11, the current $I_{WR}$ flowing from the reference layer 11 to the storage layer 10 is supplied to the MTJ element 1.

In this case, the electrons move from the storage layer 10 to the reference layer 11. Electrons having spins antiparallel to the magnetization direction of the reference layer 11 are reflected by the reference layer 11. The reflected electrons are injected into the storage layer 10 as spin-polarized electrons. The spin torque of the spin-polarized electrons (reflected electrons) is applied to the magnetization of the storage layer 10, and the magnetization of the storage layer 10 changes to the direction reverse that of the magnetization direction of the reference layer 11. When the magnetization alignment of the MTJ element 1 is antiparallel alignment (antiparallel state), the resistance value of the MTJ element 1 is maximized.

When the MTJ element 1 is used as a memory element of a magnetic memory, for example, the MTJ element 1 in a small resistance value state (the magnetization alignment is parallel) is associated with a "0" data holding state (first stable state), and the MTJ element 1 in a large resistance value state (the magnetization alignment is antiparallel) is associated with a "1" data holding state (second stable state).

When the MTJ element 1 is used as a memory element of a magnetic memory, data is written in the MTJ element 1 serving as a memory element by STT.

An operation of discriminating the resistance state of the MTJ element 1 according to this embodiment will be described with reference to (a) of FIG. 1.

When discriminating the resistance state of the MTJ element 1 according to this embodiment, a current $I_{RD}$ is supplied to the MTJ element 1, thereby determining whether the MTJ element 1 is in the "0" data holding state (magnetization parallel state or low-resistance state) or "1" data holding state (magnetization antiparallel state or high-resistance state). The magnitude of a signal (read output or read signal) based on the current (to be referred to as a read current or resistance determination current hereinafter) $I_{RD}$ flowing to the MTJ element 1 to discriminate the resistance state varies in accordance with the resistance value of the MTJ element 1. The current value of the read current $I_{RD}$ is set to a value smaller than the current value (reversal threshold) of the write current $I_{WR}$ so that the magnetization of the storage layer 10 is not reversed by the read current $I_{RD}$.

As described above, when the MTJ element 1 is used as a memory element of a magnetic memory, a current is supplied to the MTJ element 1, thereby reading data stored in the MTJ element serving as a memory element.

As shown in (a) and (b) of FIG. 1, the MTJ element 1 of this embodiment includes the magnetic field application layer 15 for applying a magnetic field to the storage layer 10 when discriminating the resistance state of the MTJ element.

The magnetic field application layer 15 is provided between the underlying layer 16 and the lower electrode 19A. The magnetic field application layer 15 is adjacent to the storage layer 10 while sandwiching the underlying layer 16. The magnetic field application layer 15 is electrically connected to the storage layer 10 via the underlying layer 16.

The magnetic field application layer 15 is formed so as to apply a magnetic field to the storage layer 10 to suppress magnetization (spin) reversal of the storage layer 10 when discriminating the resistance state of the MTJ element 1. The magnetic field application layer 15 is formed so as not to apply a magnetic field to the storage layer 10 or apply a magnetic field much smaller than that applied to the storage layer 10 upon discriminating the resistance state when reversing the magnetization of the MTJ element 1.

A current common to the current (read current or write current) $I_{RD}$ or $I_{WR}$ supplied to the storage layer 10 and the reference layer 11 is supplied to the magnetic field application layer 15.

The magnetic field application layer 15 is formed using a material that changes the magnitude of the magnetization due to a current supplied to it or an energy (for example, heat) generated by the current, and more specifically, makes the magnetization of the magnetic film smaller when a larger current is supplied.

The magnitude of the magnetization of the magnetic field application layer 15 is thus changed by the current $I_{RD}$ or $I_{WR}$ flowing in it. A magnetization M1 of the magnetic field application layer 15 at the time of supplying the current (read current) $I_{RD}$ for discriminating the resistance state of the MTJ element 1 is larger than a magnetization M2 of the magnetic field application layer 15 at the time of supplying the write current (write current) $I_{WR}$ for magnetization reversal of the storage layer 10 of the MTJ element 1.

In the MTJ element 1 of this embodiment, the magnetic field application layer 15 is formed using an in-plane magnetic film having a magnetization parallel to the film surface of the magnetic field application layer 15.

When a small current is supplied to the magnetic field application layer 15 in the MTJ element 1, the magnetic field application layer 15 generates a magnetic field caused by the magnetizations M1 and M2. The magnetic field generated by the magnetic field application layer 15 is parallel to the film surface of the storage layer 10 near the storage layer 10. The magnetic field from the magnetic field application layer 15, which is parallel to the film surface of the storage layer 10, is applied to the perpendicular magnetization of the storage layer 10. A magnetic field MF1 applied from the magnetic field application layer 15 to the storage layer 10, which is parallel to the film surface of the storage layer 10, will be referred to as an in-plane magnetic field hereinafter. The magnetic field application layer 15 will also be referred to as an in-plane magnetic field generation layer.

Figure 2:
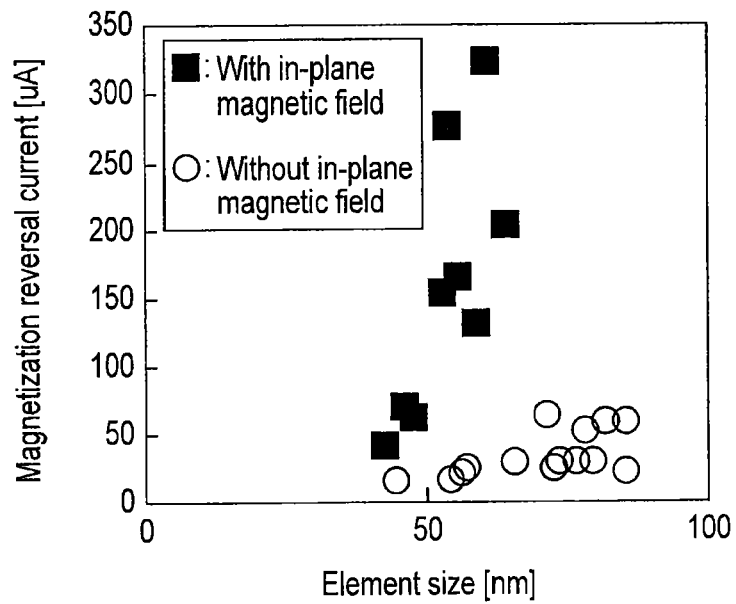

FIG. 2 is a graph showing the relationship between the magnetization reversal current and the presence/absence of a magnetic field from the magnetic field application layer (in-plane magnetic field generation layer) in the MTJ element. The abscissa of FIG. 2 represents the size (the maximum size of the planar shape) (unit [nm]) of the MTJ element, and the ordinate of FIG. 2 represents the magnetization reversal current (unit [μA]) of the MTJ element. FIG. 2 shows the magnetization reversal current (open circles in FIG. 2) of an MTJ element with the magnetic field application layer 15 for generating an in-plane magnetic field and the magnetization reversal current (full squares in FIG. 2) of an MTJ element without the magnetic field application layer.

As shown in FIG. 2, in all element sizes of the MTJ elements, the magnetization reversal current of the MTJ element when a magnetic field from the magnetic field application layer 15 is applied to the MTJ element 1 is larger than that of the MTJ element in the MTJ element 1 (when the magnetic field application layer is not applying a magnetic field to the MTJ element) that includes no magnetic field application layer.

The result shown in FIG. 2 indicates that in the MTJ element 1 including the magnetic field application layer 15, when the in-plane magnetic field from the magnetic field application layer 15 is applied to the perpendicular magnetization of the storage layer 10, the magnetization reversal of the storage layer 10 of the MTJ element 1 hardly occurs as compared to the case in which the in-plane magnetic field from the magnetic field application layer 15 is not applied to the storage layer 10. In addition, if the magnetic field from the magnetic field application layer 15 is not applied to the storage layer 10, the magnetization of the storage layer 10 of the MTJ element 1 can be reversed by a small magnetization reversal current (write current) even when the magnetic field application layer 15 is provided.

Figure 3:
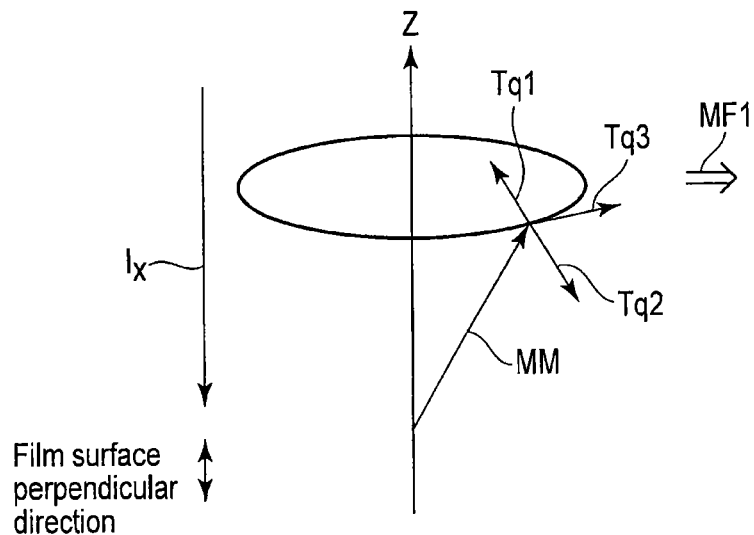

The movement state of a spin in a magnetic film when a current is supplied to the magnetic film serving as the storage layer 10 will be explained with reference to FIG. 3.

When a current is supplied to the magnetic film, a spin MM in the magnetic film performs precession. At the time of the precession of the spin MM in the magnetic film, a first torque (force) Tq1 that relaxes the magnetization in the Z direction, a second torque Tq2 that acts in a direction reverse to the first torque Tq1, and a third torque Tq3 that acts in the tangential direction of the equatorial plane of the prerecession are generated.

In STT, these torques Tq1, Tq2, and Tq3 depend on the physical parameter of the magnetic film and the magnitude of a supplied current Ix.

The first torque (to be referred to as an attenuation torque hereinafter) Tq1 depends on the damping constant of the magnetic film (for example, storage layer). As the damping constant of the magnetic film becomes large, the magnitude of the attenuation torque (also called a relaxation term or damping torque) Tq1 becomes large, and reversal of the spin MM by the precession is suppressed. For this reason, when STT is used for magnetization reversal of the magnetic film, as described above, the physical parameter of the storage layer 10 is set so as to make the damping constant of the magnetic film used as the storage layer 10 smaller.

The second torque Tq2 is a spin torque. In STT, the spin torque Tq2 (also called a spin transfer torque) mainly depends on the magnitude of the supplied current Ix. The precession by the spin torque in the perpendicular magnetization film moves such that the top rotates parallel to the in-plane direction of the film. When the current Ix supplied to the magnetic film becomes large, the torque Tq2 applied to the spin MM becomes large. When the magnitude of the current Ix increases, the magnitude of the torque Tq2 becomes larger than that of the torque Tq1. When the magnitude of the current Ix is equal to or larger than a predetermined critical value (magnetization reversal threshold), the direction of the spin MM reverses.

As described above, to reverse the magnetization of the MTJ element 1, the write current $I_{WR}$ equal to or larger than the magnetization reversal threshold of the storage layer 10 is supplied to the MTJ element 1.

On the other hand, to discriminate the resistance state of the MTJ element 1, the read current $I_{RD}$ smaller than the magnetization reversal threshold is supplied to the MTJ element 1 so that the magnetization (spin) of the storage layer 10 is not reversed. However, when the read current $I_{RD}$ is made small to suppress magnetization reversal of the storage layer 10, it is difficult to detect the current flowing to the MTJ element 1. It is therefore difficult to discriminate between the high-resistance state and the low-resistance state of the MTJ element 1.

Even when the read current $I_{RD}$ is made large within the range smaller than the magnetization reversal threshold to improve the accuracy of discrimination of the resistance state of the MTJ element 1, a read disturbance may occur in which the spin (the magnetization of the magnetic film) reverses unintentionally due to thermal agitation of the magnetic film. For example, when a plurality of MTJ elements 1 are provided in a memory cell array, as in a magnetic memory, the characteristics vary between the elements. Even in the single MTJ element 1, the magnetization reversal current varies due to thermal fluctuation. Hence, if a read current having the same magnitude is used, the possibility a read disturbance occurs in the memory cell array becomes high. The read operation of a memory that uses different read currents for the elements in consideration of the characteristic variations between the elements is hard to control.

When the damping constant of the magnetic film serving as the storage layer 10 is made large to suppress the read disturbance, the magnetization reversal threshold increases, and the write current $I_{WR}$ becomes large. This leads to an increase in the power consumption of a memory using the MTJ element.

As shown in (a) of FIG. 1, when discriminating the resistance state of the MTJ element 1, the magnetic field application layer (to be also referred to as an in-plane magnetic field generation layer hereinafter) 15 having in-plane magnetization applies, to the storage layer 10, the predetermined magnetic field (in-plane magnetic field) MF1 parallel to the film surface of the storage layer 10. As shown in FIG. 3, a force resulting from a magnetic field MF of the magnetic field application layer 15 having in-plane magnetization is applied to the spin MM of the storage layer 10 of perpendicular magnetization. As a result, the precession (or magnetization) of the spin MM is suppressed. This allows to reduce unintended reversal of the spin of the storage layer 10 when discriminating the resistance state of the MTJ element 1.

For this reason, it is possible to discriminate the resistance state of the MTJ element 1 using the relatively large read current $I_{RD}$ without making the damping constant of the storage layer 10 large to suppress the read disturbance.

When the MTJ element is used in a magnetic memory (for example, MRAM), the adverse effect of RC delay can be suppressed by using the relatively large read current so that a large read output (read signal or detection signal) and a high-speed operation can be implemented.

At the time of magnetization reversal of the storage layer 10 of the MTJ element 1, the magnetization of the magnetic field application layer 15 having in-plane magnetization disappears or decreases due to the supplied magnetization reversal current $I_{WR}$. Because of the disappearance or reduction of the magnetization of the magnetic field application layer 15, the magnetic field applied to the storage layer 10 becomes almost zero or smaller than the magnetic field at the time of discriminating the resistance state of the MTJ element 1. As a result, the spin MM that performs the precession in the storage layer 10 is hardly affected by the force caused by the magnetic field of the magnetic field application layer 15.

For this reason, even when the magnetic field application layer 15 is provided in the MTJ element 1, the magnetic field from the magnetic field application layer 15 does not adversely affect the magnetization (spin) reversal of the storage layer 10 at the time of magnetization reversal of the MTJ element 1 by STT. Hence, the MTJ element 1 including the magnetic field application layer 15 according to this embodiment can increase the current to be supplied to discriminate the resistance state of the MTJ element without increasing the magnetization reversal current. As a result, the MTJ element 1 of this embodiment can reduce unintended magnetization reversal of the storage layer 10 upon discriminating the resistance state and improve the accuracy of discrimination of the resistance state of the MTJ element.

As described above, according to the magnetoresistive element of this embodiment, an operation error of the magnetoresistive element can be suppressed.

(b) Arrangement Example 1

Arrangement Example 1 of the magnetoresistive element according to the first embodiment will be described with reference to FIGS. 4, 5, and 6.

FIG. 4 is a sectional view showing the structure of a magnetoresistive element 1A of this embodiment. As shown in FIG. 4, the MTJ element 1A according to Arrangement Example 1 of this embodiment includes the storage layer 10, the reference layer 11, and the nonmagnetic film 12.

The MTJ element 1A shown in FIG. 4 is of, for example, a top-pin type in which the nonmagnetic film 12 is stacked on the storage layer 10 above the lower electrode 19A, and the reference layer 11 is stacked on the nonmagnetic film 12.

The perpendicular magnetic anisotropy of the magnetic films (storage layer and reference layer) 10 and 11 included in the MTJ element 1A is formed using the magnetocrystalline anisotropy of the magnetic material (magnetic films).

In the MTJ element 1A of the perpendicular magnetization type using the magnetocrystalline anisotropy, the c-axis of a crystal corresponds to the direction perpendicular to the film surface. For this reason, even if each crystal grain rotates in the in-plane direction of the film, the c-axes of the crystals remain perpendicular to the film surface and are not dispersed. Hence, the perpendicular magnetization film using the magnetocrystalline anisotropy can suppress the dispersion of the crystal axes.

An example of a material having a high magnetocrystalline anisotropy energy density is a Co—Cr alloy. The Co—Cr alloy material has a hexagonal structure and a uniaxial magnetocrystalline anisotropy having the c-axis as the axis of easy magnetization. Hence, the direction of crystal growth of the Co—Cr alloy is controlled such that the c-axes of the crystals become parallel to the direction perpendicular to the film surface in the crystal orientation of the magnetic film using the Co—Cr alloy. The dispersion of the crystal axes in the magnetic film using the magnetocrystalline anisotropy is thus suppressed.

Similarly, even when a magnetic film having a tetragonal structure is used in the MTJ element 1A, the perpendicular magnetization MTJ structure can be implemented by controlling the c-axis to be perpendicular to the film surface. As the magnetic material having a tetragonal structure, for example, a material having an $L1_0$ structure is used. Examples are an Fe—Pt ordered alloy, Fe—Pd ordered alloy, Co—Pt ordered alloy, Fe—Co—Pt ordered alloy, Fe—Ni—Pt ordered alloy, and Fe—Ni—Pd ordered alloy. When a material having an $L1_0$ structure is used as the perpendicular magnetization film, it preferably has a preferred orientation along the (001) plane as a crystal orientation.

The perpendicular magnetic anisotropy of the magnetic films 10 and 11 of the MTJ element 1A may manifest itself using the interface magnetic anisotropy of the magnetic films caused by the distortion of the interface between the stack films or the electron state in the interface. Even when the perpendicular magnetic anisotropy of the magnetic films 10 and 11 is formed by the interface magnetic anisotropy, dispersion of the crystals can be suppressed, as in the case in which the magnetocrystalline anisotropy is used to form the perpendicular magnetization film. When the dispersion of the crystal axes is suppressed, the increase in the reversal threshold current is suppressed.

An example of a perpendicular magnetization film using the interface magnetic anisotropy is an artificial lattice. An example of the artificial lattice is a structure in which Co as a magnetic material and Pt (or Pd) as a nonmagnetic material are alternately stacked. Each magnetic material (layer) in the artificial lattice is preferably as a film thickness of about 0.3 to 1.0 nm to improve the magnetic anisotropy energy density. However, the thinner each layer in the artificial lattice is, the more conspicuous the spin pumping effect is, and the larger the damping constant of the artificial lattice is. Hence, when using the artificial lattice as the storage layer 10, the film thickness of each layer of the artificial lattice is preferably taken into consideration. Alternatively, using an MgO film for the nonmagnetic film 12 and an FeB film or CoFeB film for the storage layer 10 enables to generate an interface magnetic anisotropy between the MgO film and the FeB film or between the MgO film and the CoFeB film and thus form a magnetic film having a perpendicular magnetic anisotropy. The perpendicular magnetic anisotropy manifests itself between the nonmagnetic film 12 and the storage layer 10. It is therefore possible to suppress the anisotropic dispersion and suppress an increase in the write current.

The nonmagnetic film 12 is, for example, a magnesium oxide (MgO) film. The nonmagnetic film 12 using an insulating film such as an MgO film is called the tunnel barrier layer 12. The nonmagnetic film 12 will be referred to as the tunnel barrier layer 12 hereinafter.

For example, calcium oxide (CaO), strontium oxide (SrO), titanium oxide (TiO), vanadium oxide (VO), niobium oxide (NbO), or aluminum oxide ($Al_2O_3$) may be used for the nonmagnetic film. Mg nitride or Al nitride may be used for the nonmagnetic film. Not a single-layered film of the oxide or nitride but a stack film of these insulating materials may be used for the nonmagnetic film 12.

MgO has a sodium chloride (NaCl) structure. When a material such as MgO having the NaCl structure is used as the nonmagnetic film (tunnel barrier layer) 12, the MgO film serving as the nonmagnetic film 12 has a crystal orientation. For example, the crystal preferably has a preferred orientation along the fcc (001) plane (or orientation) and a plane (or orientation) equivalent to it.

Interface layers (not shown) may be provided between the storage layer 10 and the tunnel barrier layer 12 and between the reference layer 11 and the tunnel barrier layer 12. The interface layers are magnetic films in contact with the tunnel barrier layer 12. Note that not only the magnetic films provided separately from the storage layer 10 and reference layer 11 but also portions (regions) of the storage layer 10 and reference layer 11 in contact with the tunnel barrier layer 12 may be called interface layers. The interface layers relax the lattice mismatch between the tunnel barrier layer 12 and the magnetic films 10 and 11 and improve the crystallinity of the tunnel barrier layer 12 and the magnetic films 10 and 11. As a result, the characteristic (for example, MR ratio) of the MTJ element improves. For example, an interface layer is formed using a magnetic film containing at least two elements selected from the group consisting of Co (cobalt), Fe (iron), and B (boron). However, the material of the interface layer is not limited to a magnetic film containing Co, Fe, or B.

The MTJ element 1A may include a shift adjustment layer (not shown) having a magnetization in a direction reverse to the magnetization direction of the reference layer 11. The shift adjustment layer makes a leakage magnetic field (magnetostatic stray field) caused by the reference layer 11 almost zero, thereby suppressing shift field generation in the storage layer 10 due to the leakage field from the reference layer 11. For example, the shift adjustment layer (also called a bias layer, a shift field control layer) is provided on a side (surface) of the reference layer 11 opposite to the side (surface) where the tunnel barrier layer 12 is provided.

The underlying layer (intermediate layer) 16 is provided in the MTJ element 1A so as to come into contact with the storage layer 10. For example, the underlying layer 16 is provided on a side of the storage layer 10 opposite to the side where the tunnel barrier layer 12 is provided. The underlying layer 16 is provided between the storage layer 10 and the lower electrode 19A. When the MTJ element 1A has a top-pin structure, the storage layer 10 is stacked on the underlying layer 16. The storage layer 10 is provided between the underlying layer 16 and the tunnel barrier layer 12. To improve the magnetic characteristic of the storage layer 10, a material having a close-packed atomic plane may be used for the underlying layer 16 in accordance with the material of the storage layer 10. Alternatively, to reduce the damping constant of the storage layer 10, a material having a small spin pumping effect between the storage layer 10 and the underlying layer 16 may be used for the underlying layer 16. For example, platinum (Pt), palladium (Pd), iridium (Ir), tungsten (W), tantalum (Ta), hafnium (Hf), or the like is used for the underlying layer 16 as the material having a close-packed atomic plane. Alternatively, a nitride, boride, or the like is used for the underlying layer 16 as the material having a small spin pumping effect.

The upper electrode 19B of the MTJ element 1A may be used as a hard mask to work the MTJ element 1A into a predetermined shape. The lower electrode 19A of the MTJ element 1A is provided on a substrate (not shown). For the lower electrode 19A and the upper electrode 19B, for example, tantalum (Ta), titanium (Ti), tantalum nitride (TaN), titanium nitride (TiN), or a stack film thereof is used. Ir or ruthenium (Ru) may be used for the lower electrode 19A.

A magnetic field application layer 15A is provided between the lower electrode 19A and the underlying layer 16.

In Arrangement Example 1, the in-plane magnetization film 15A serving as the magnetic field application layer 15A is, for example, a stack film of a magnetic film (FePd film) 151 containing iron (Fe) and palladium (Pd) and an MgO film 152. For example, in the FePd film 151 of the magnetic field application layer 15A, the content (concentration) of Fe is higher than the content (concentration) of Pd. Hence, the FePd film 151 has a magnetic anisotropy parallel to its film surface so that the FePd film 151 having in-plane magnetization (parallel magnetization) is formed. The FePd film 151 having in-plane magnetization has a film thickness of 2 nm.

The resistance value of the MgO film 152 of the magnetic field application layer 15A is smaller than that of the MgO film serving as the tunnel barrier layer 12. The MgO film 152 of the magnetic field application layer 15A is thinner than the MgO film serving as the tunnel barrier layer 12. The MgO film 152 of the magnetic field application layer 15A has a film thickness of, for example, 1 nm or less. The MgO film 152 serves as, for example, a tunnel film to which a current flows. For example, an MgO film having a film thickness of about 1 nm has a resistance value of about 10 $\Omega \cdot \mu m^2$.

For example, in the magnetic field application layer 15A, the FePd film 151 is provided on the side of the storage layer 10. The MgO film 152 is preferably provided on the side of the lower electrode 19A such that Joule heat from the MgO film 152 at the time of current supply is not applied to the storage layer 10. The FePd film 151 is in contact with the underlying layer 16, and the MgO film 152 is in contact with the lower electrode 19A. The FePd film 151 is stacked on the MgO film 152 on the lower electrode 19A. The magnetic field application layer 15A formed from the stack film of the MgO film 152 and the FePd film 151 on the MgO film 152 will be referred to as an FePd/MgO film 15A hereinafter. A stack film "A/B" means that "A" is stacked on "B" hereinafter.

As shown in FIG. 5, the magnetic field application layer 15A including the FePd film 151 and the MgO film 152 may have a structure (artificial lattice) formed by alternately stacking a plurality of FePd films 151 and a plurality of MgO films 152 at a predetermined period. Fe and Pd may form an artificial lattice.

When a current is supplied into the FePd/MgO film 15A, the magnetization of the FePd/MgO film decreases. As a result, the magnitude of the magnetic field caused by the FePd/MgO film 15A changes depending on the magnitude of the current or voltage. When the write current $I_{WR}$ having a predetermined magnitude is supplied to the FePd/MgO film 15A, the physical parameter of the FePd/MgO film 15A is adjusted such that the magnetization of the FePd/MgO film 15A disappears. Alternatively, when the write current $I_{WR}$ is supplied to the FePd/MgO film 15A, the physical parameter of the FePd/MgO film 15A is adjusted such that its magnetization becomes much smaller than that when the read current $I_{RD}$ having a predetermined magnitude is supplied. The FePd/MgO film 15A is thus designed not to increase the magnetization reversal current serving as the write current $I_{WR}$ by its in-plane magnetization at the time of magnetization reversal of the MTJ element 1A by STT.

FIG. 6 is a graph schematically showing the current dependence of the magnetization of the FePd/MgO film. The abscissa of FIG. 6 represents the current (arbitrary unit) supplied to the FePd/MgO film, and the ordinate of FIG. 6 represents the magnetization (arbitrary unit) of the FePd/MgO film.

As shown in FIG. 6, the magnetization of the FePd/MgO film 15A serving as the magnetic field application layer 15A decreases in accordance with the magnitude of the supplied current.

As described above, the magnitude (current value) of the read current (resistance discrimination current) $I_{RD}$ is smaller than that of the write current (magnetization reversal current) $I_{WR}$.

For this reason, as shown in FIG. 6, even when the read current $I_{RD}$ is supplied to the FePd/MgO film 15A of the MTJ element 1A, the FePd/MgO film 15A has the magnetization M1.

Hence, when discriminating the resistance state of the MTJ element 1A (at the time of data read), the magnetic field MF1 caused by the magnetization M1 of the FePd/MgO film 15A is constantly applied to the storage layer 10.

The magnetic field MF1 caused by the magnetization M1 of the FePd/MgO film 15A has a direction parallel to the film surface of the storage layer 10. The magnetic field MF1 from the FePd/MgO film having a magnetization direction parallel to the film surface of the storage layer 10 is applied to the storage layer 10.

The magnetic field MF1 from the FePd/MgO film 15A serving as the magnetic field application layer 15A, which is parallel to the film surface, gives the spin (magnetization) of the storage layer 10, which is perpendicular to the film surface, a force (magnetic field) in a direction to suppress the precession of the spin.

As a result, when a small current such as the read current $I_{RD}$ flows in the MTJ element 1A, the magnetic field MF1 caused by the magnetization M1 of the magnetic field application layer 15A suppresses magnetization reversal of the storage layer 10. This allows to prevent magnetization reversal of the storage layer 10 of the MTJ element 1A caused by the read current $I_{RD}$ and thus suppress a read disturbance when discriminating the resistance state of the MTJ element 1A.

As shown in FIG. 6, the FePd/MgO film 15A has a characteristic for decreasing its magnetization M2 when the current flowing in the stack film 15A becomes large.

Hence, when the write current $I_{WR}$ larger than the read current $I_{RD}$ flows in the FePd/MgO stack film, the magnetization of the FePd/MgO film 15A becomes small. That is, the magnetization M2 of the FePd/MgO film 15A upon supplying the write current $I_{WR}$ is smaller than the magnetization M1 of the FePd/MgO film 15A upon supplying the read current $I_{RD}$.

For example, a parameter (for example, film thickness or composition ratio) of the FePd/MgO film 15A is preferably adjusted such that the magnetization of the FePd/MgO film 15A disappears (becomes almost zero) when the write current $I_{WR}$ flows in the FePd/MgO film 15A.

When reversing the magnetization of the storage layer 10 of the MTJ element 1A (at the time of data write), the magnetization M2 of the magnetic field application layer becomes sufficiently small or disappears due to the write current $I_{WR}$. The magnetic field MF2 from the magnetic field application layer 15A when reversing the magnetization of the MTJ element 1A thus becomes smaller than the in-plane magnetic field MF1 applied from the magnetic field application layer 15A to the storage layer 10, or the magnetic field is hardly applied (becomes almost zero) when discriminating the resistance state of the MTJ element 1A.

As a consequence, when reversing the magnetization of the storage layer 10 of the MTJ element 1A, the magnetization of the magnetic field application layer 15A rarely affects the storage layer 10. For this reason, the spin that forms the magnetization of the storage layer 10 freely performs precession by the spin torque of the write current $I_{WR}$ without any adverse affect of the magnetic field from the magnetic field application layer 15A.

Hence, even when the MTJ element 1A includes the magnetic field application layer 15A having in-plane magnetization in which the magnitude of the magnetization (generated magnetic field) changes in accordance with the magnitude of the supplied current $I_{RD}$ or $I_{WR}$, the magnetization of the storage layer 10 can be reversed without increasing the write current (magnetization reversal current) $I_{WR}$ caused by the in-plane magnetization generated from the magnetic field application layer 15A, which is parallel to the film surface of the storage layer 10.

In Arrangement Example 1, the stack structure of the FePd film and the MgO film is used for the magnetic field application layer 15A. However, any other material may be used as long as an in-plane magnetization film (stack structure or artificial lattice) in which the magnitude of the magnetization changes in accordance with the magnitude of the supplied current is formed.

As described above, according to the magnetoresistive element 1A of Arrangement Example 1 of this embodiment, an operation error of the magnetoresistive element 1A can be suppressed.

(c) Arrangement Example 2

Arrangement Example 2 of the magnetoresistive element according to the first embodiment will be described with reference to FIG. 7. The structure of the magnetoresistive element (MTJ element) of Arrangement Example 2 is almost the same as that of the magnetoresistive element 1A of Arrangement Example 1 described above. Hence, the structure of the magnetoresistive element of Arrangement Example 2 will be explained with reference to FIG. 4.

In Arrangement Example 2, a ferrimagnetic film (ferrimagnetic material) is used for the in-plane magnetization film serving as the magnetic field application layer (in-plane magnetic field generation layer) 15A. The ferrimagnetic film 151 in the magnetic field application layer 15A contains a rare earth metal and a transition metal. In the magnetic field application layer 15A, at least one element selected from the group consisting of terbium (Tb), dysprosium (Dy), and gadolinium (Gd) is used as the rare earth metal, and at least one element selected from the group consisting of iron (Fe) and cobalt (Co) is used as the transition metal.

In the ferrimagnetic material, the sublattice of the rare earth metal and the sublattice of the transition metal have spins in directions opposite to each other. The sublattices have magnetizations of different magnitudes in a temperature range excluding that near the compensation temperature (Neel temperature). The ferrimagnetic material has a magnetization due to the difference in the magnitude of the magnetization of the spin between the sublattices. When the sublattices have a magnetization of the same magnitude at the compensation temperature, the magnetization of the ferrimagnetic material disappears. In this embodiment, the in-plane magnetization film 151 using the ferrimagnetic material is formed by, for example, setting the concentration (composition ratio) of the rare earth metal element in the film 151 to 25 at % [atomic %] or more. Note that the in-plane magnetization film 151 may be formed by the artificial lattice of the ferrimagnetic material.

For example, the resistive film 152 is provided between the lower electrode 19A and the ferrimagnetic film 151 serving as the magnetic field application layer 15A. For example, the resistive film 152 is formed using an MgO film or an aluminum oxide ($Al_2O_3$) film. The resistance value of the MgO film serving as the resistive film 152 is preferably smaller than that of the MgO film serving as the tunnel barrier layer 12 within a range where the film does not serve as an insulator. The MgO film serving as the resistive film 152 is thinner than, for example, the MgO film serving as the tunnel barrier layer 12. The resistive film 152 serves as a tunnel film to which a current flows.

When the current $I_{RD}$ or $I_{WR}$ is supplied to the ferrimagnetic film 151 or the resistive film 152, the resistive film 152 or ferrimagnetic film 151 itself generates Joule heat. The ferrimagnetic film 151 is heated by the Joule heat. The read current $I_{RD}$ is smaller than the write current $I_{WR}$. For this reason, the Joule heat generated in the magnetic field application layer 15A by the read current $I_{RD}$ is smaller than the Joule heat generated by the magnetic field application layer 15A by the write current $I_{WR}$.

The resistance value of the resistive film 152, in other words, the physical parameter (film thickness or composition) of the resistive film 152 is preferably adjusted such that the Joule heat generated by the resistive film 152 and the write current $I_{WR}$ becomes the compensation temperature of the ferrimagnetic film.

The magnetization state of the magnetic field application layer 15A using the ferrimagnetic film having in-plane magnetization when discriminating the resistance state of the MTJ element and reversing the magnetization of the storage layer 10 will be described with reference to FIG. 7.

FIG. 7 is a graph schematically showing the current dependence of the magnetization of the ferrimagnetic film. The abscissa of FIG. 7 represents the current supplied to the ferrimagnetic film, and the ordinate of FIG. 7 represents the magnitude of the magnetization of the ferrimagnetic film.

When discriminating the resistance state of the MTJ element 1A (at the time of data read), the ferrimagnetic film 151 in the magnetic field application layer 15A to which the read current $I_{RD}$ is supplied applies, to the storage layer 10, an in-plane magnetic field caused by the magnetization M1 of the ferrimagnetic film, which is parallel to the film surface of the storage layer 10, as in Arrangement Example 1. The read current $I_{RD}$ is smaller than the write current $I_{WR}$, and the Joule heat generated upon supplying the read current $I_{RD}$ is small. For this reason, the decrease in the magnetization of the ferrimagnetic film 151 of the magnetic field application layer 15A is small or almost zero. The in-plane magnetic field caused by the magnetization M1 of the magnetic field application layer 15A is thus applied to the perpendicular magnetization of the storage layer 10.

Hence, when discriminating the resistance state of the MTJ element, the in-plane magnetic field from the magnetic field application layer 15A can suppress unintended reversal (read disturbance) of the magnetization of the storage layer 10.

When reversing the magnetization of the storage layer 10 of the MTJ element 1A by STT (at the time of data write), a relatively large amount of Joule heat is generated in the ferrimagnetic film 151 and the resistive film 152 by the write current $I_{WR}$, which is larger than the read current $I_{RD}$. The magnetization of the magnetic field application layer 15A decreases due to the Joule heat. When the Joule heat generated by the magnetic field application layer (resistive film) and the supplied current reaches the compensation temperature (Neel temperature) of the ferrimagnetic film 151 in the magnetic field application layer 15A, the magnetization of the ferrimagnetic film 151 disappears. For example, the physical parameters of the ferrimagnetic film 151 and the resistive film 152 in the magnetic field application layer 15A are preferably adjusted such that the magnetization of the magnetic field application layer 15A almost disappears, and the magnetic field application layer 15A does not generate an in-plane magnetic field at a temperature of about 100° C. caused by the write current $I_{WR}$.

As a result of decrease or disappearance of the magnetization of the magnetic field application layer 15A by the Joule heat caused by the write current $I_{WR}$, the magnetic field generated by the magnetic field application layer 15A decreases, and the in-plane magnetic field applied to the storage layer 10 decreases.

Hence, when reversing the magnetization of the storage layer 10 of the MTJ element 1A by STT, it is possible to reverse the magnetization of the storage layer 10 of the MTJ element 1A using the write current $I_{WR}$ having a reversal threshold depending on the physical parameter of the storage layer 10 without increasing the current value of the write current (magnetization reversal current) $I_{WR}$ due to the adverse affect of the in-plane magnetic field.

As described above, according to Arrangement Example 2 of the magnetoresistive element of this embodiment, the same effect as that of the magnetoresistive element of Arrangement Example 1 can be obtained, and an operation error of the magnetoresistive element can be suppressed.

(2) Second Embodiment

A magnetoresistive element according to the second embodiment will be described with reference to FIGS. 8, 9, 10 and 11. In the magnetoresistive element of this embodiment, the same reference numerals as in the magnetoresistive element of the first embodiment denote components having almost the same arrangements, and a description thereof will be made as needed.

Figure 8:
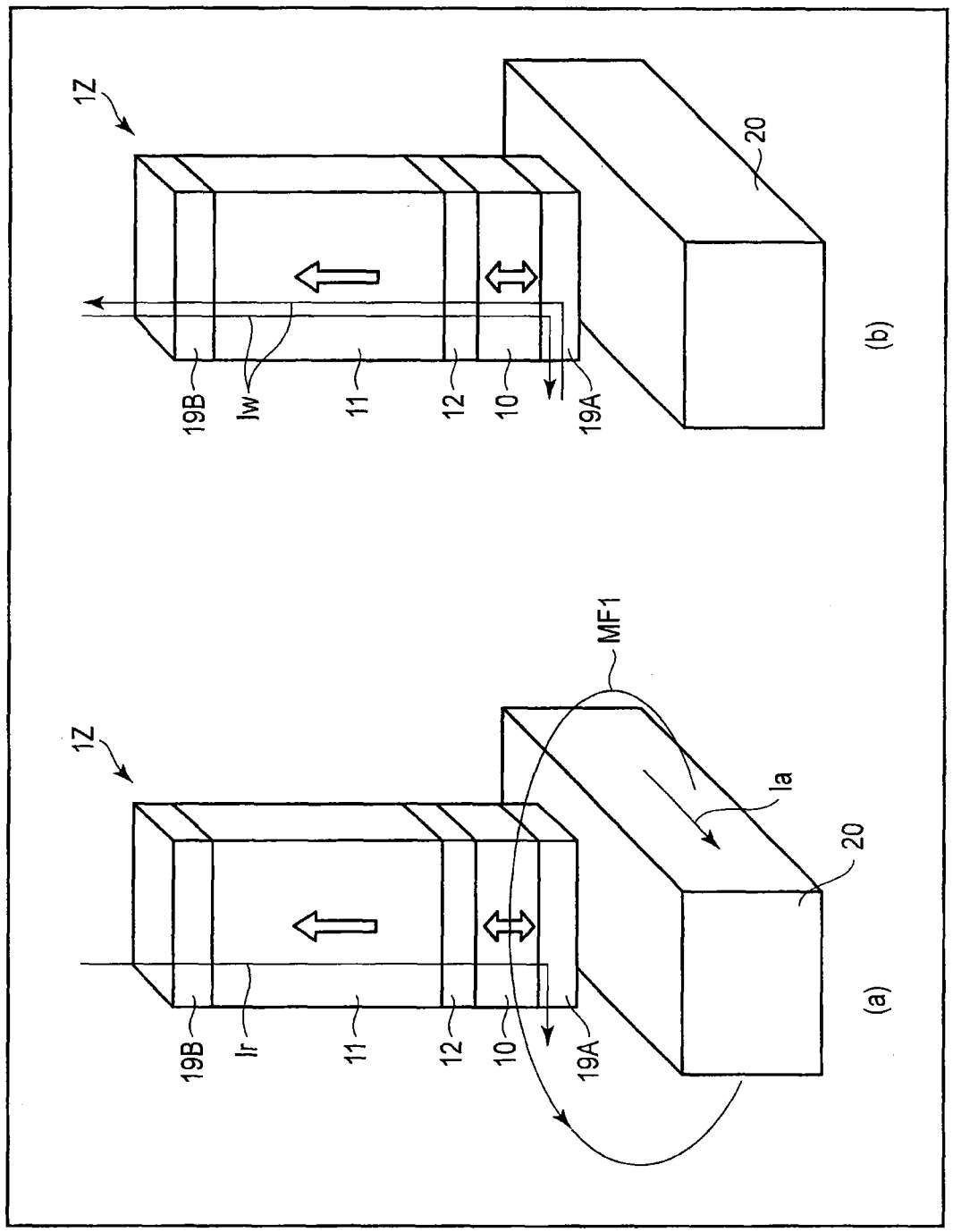

FIG. 8 are schematic views for explaining the structure and operation of a magnetoresistive element 1Z of the second embodiment. FIG. 9 is a sectional view showing the structure of the magnetoresistive element 1Z of the second embodiment.

As shown in FIGS. 8 and 9, the MTJ element 1Z of this embodiment includes an insulating layer 29 provided between a magnetic field application layer 20 and a lower electrode 19A.

The magnetic field application layer 20 is electrically isolated from the lower electrode 19A and a storage layer 10 by the insulating layer 29. For this reason, neither a read current $I_{RD}$ nor a write current $I_{WR}$ flows to the magnetic field application layer 20 included in the MTJ element 1Z of the second embodiment, unlike the first embodiment. A current $I_A$ independent of the read current $I_{RD}$ and the write current $I_{WR}$ is supplied to the magnetic field application layer 20.

As shown in FIG. 8, the magnetic field application layer 20 runs parallel to the substrate surface (the film surface of the storage layer 10) so as to form an interconnection.

The magnetic field application layer 20 is formed from a metal film (or alloy) containing at least one material selected from the group consisting of, for example, aluminum (Al), copper (Cu), tungsten (W), and molybdenum (Mo). The magnetic field application layer 20 may be formed from an alloy, conductive compound, or silicide layer. To efficiently apply an in-plane magnetic field from the magnetic field application layer 20 to the storage layer 10, a magnetic material (magnetic film) 25 may be provided on a surface except the surface of the magnetic field application layer 20 facing the storage layer 10 so as to form the magnetic field application layer 20 as a yoke interconnection.

As shown in (a) of FIG. 8, when discriminating the resistance state of the magnetoresistive element (MTJ element) (at the time of data read from the MTJ element), an in-plane magnetic field (to be also referred to as an interconnection magnetic field in this embodiment) MF1 to be applied to the storage layer 10 having a perpendicular magnetization is generated by the current (to be also referred to as a magnetic field generation current or a read assist current hereinafter) $I_A$ flowing to the conductive layer (to be also referred to as a magnetic field application layer, an in-plane magnetic field generation layer, or a magnetic field generation line hereinafter).

The magnetic field application layer 20 is arranged under the storage layer 10 and the lower electrode 19A (on the substrate side) so as to apply, to the storage layer 10, a magnetic field (in-plane magnetic field) parallel to the film surface of the storage layer 10.

When the current $I_A$ is supplied to the magnetic field application layer 20, the magnetic field MF1 is generated around the magnetic field application layer 20 based on the corkscrew rule (Ampere's law). The magnetic field generated around the magnetic field application layer 20 due to the current flowing to the magnetic field application layer 20 has a direction parallel to the film surface of the storage layer 10 near the storage layer 10. The magnetic field from the magnetic field application layer 20 is applied to the storage layer 10 as an in-plane magnetic field for the storage layer 10.

The magnitude of the current $I_A$ to be supplied to the magnetic field application layer 20 and the interval between the storage layer 10 and the magnetic field application layer 20 are appropriately adjusted so as to generate the magnetic field MF1 having a predetermined magnitude when discriminating the resistance state of the MTJ element 1Z.

The operation of the MTJ element 1Z according to this embodiment will be described with reference to FIGS. 10 and 11 in addition to (a) and (b) of FIG. 8.

The magnetic field generation current supply timing for the magnetic field application layer 20 and the pulse shape of the magnetic field generation current will be explained with reference to FIGS. 10 and 11. FIGS. 10 and 11 show the pulse shapes of the read current and write current supplied to the MTJ element, and the pulse shape of the magnetic field generation current supplied to the magnetic field application layer. The abscissas of FIGS. 10 and 11 correspond to time, and the ordinates of FIGS. 10 and 11 correspond to the current values of the currents.

Figure 10:
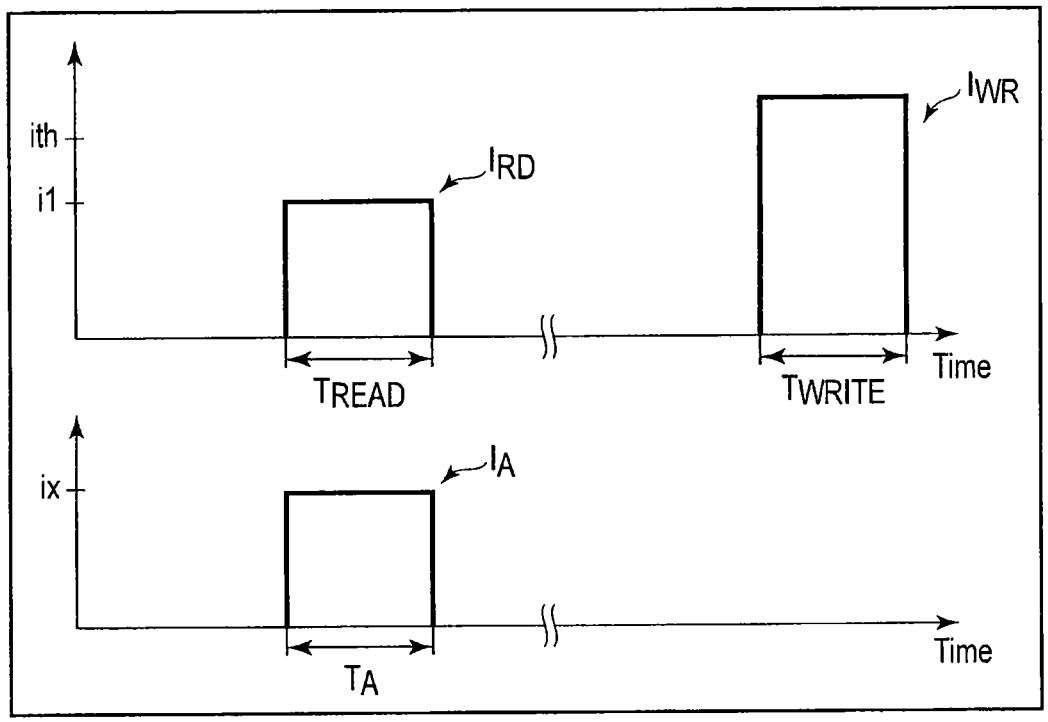

As shown in FIG. 10, for example, the magnetic field generation current $I_A$ is supplied almost at the same time as the read current $I_{RD}$ is supplied to the MTJ element 1Z.

For example, the leading edge of the magnetic field generation current is set to the same time as the leading edge of the read current $I_{RD}$. During a predetermined period $T_{READ}$ for discriminating the resistance state of the MTJ element 1Z (reading data), the read current $I_{RD}$ having a predetermined current value is supplied to the MTJ element 1Z, and the read current $I_{RD}$ rises to a predetermined current value i1.

At the same time as the read current $I_{RD}$ rises, the magnetic field generation current rises to a predetermined current value ix. When the magnetic field generation current $I_A$ is supplied to the magnetic field application layer 20, the magnetic field MF1 is generated around the magnetic field application layer 20 in accordance with the corkscrew rule. The magnetic field MF1 generated by the magnetic field application layer 20 depends on the magnitude ix of the magnetic field generation current $I_A$.

A magnetic field caused by the magnetic field application layer, which is parallel to the film surface of the storage layer 10, is applied to the magnetization of the storage layer 10 so as to suppress the precession of the spin of the storage layer 10.

This allows to suppress unintended reversal of the magnetization of the storage layer 10 when discriminating the resistance state of the magnetoresistive element 1Z.

After the read signal form the MTJ element 1Z is detected, the read current $I_{RD}$ and the magnetic field generation current $I_A$ fall at the same timing.

Note that the current value ix of the magnetic field generation current $I_A$ supplied to the magnetic field application layer 20 when discriminating the resistance state of the magnetoresistive element is set to such a magnitude that prevents the magnetization of the storage layer 10 from being reversed by the magnetic field MF1 of the magnetic field application layer 20 caused by the current. The current value ix of the magnetic field generation current $I_A$ supplied to the magnetic field application layer 20 is set to a magnitude that generates an in-plane magnetic field having a magnitude for suppressing the precession of the storage layer 10.

As shown in (b) of FIG. 8 and FIG. 10, when the write current $I_{WR}$ equal to or larger than a magnetization reversal threshold ith is supplied to the MTJ element 1Z, the magnetic field generation current $I_A$ is not supplied to the magnetic field application layer 20. When reversing the magnetization of the storage layer of the MTJ element 1Z, the magnetic field application layer 20 does not generate a magnetic field.

For this reason, when reversing the magnetization of the storage layer 10 of the MTJ element 1Z by a current equal to or larger than the magnetization reversal current, the magnetization reversal current can be prevented from increasing by the magnetic field from the magnetic field application layer 20.

Figure 11:
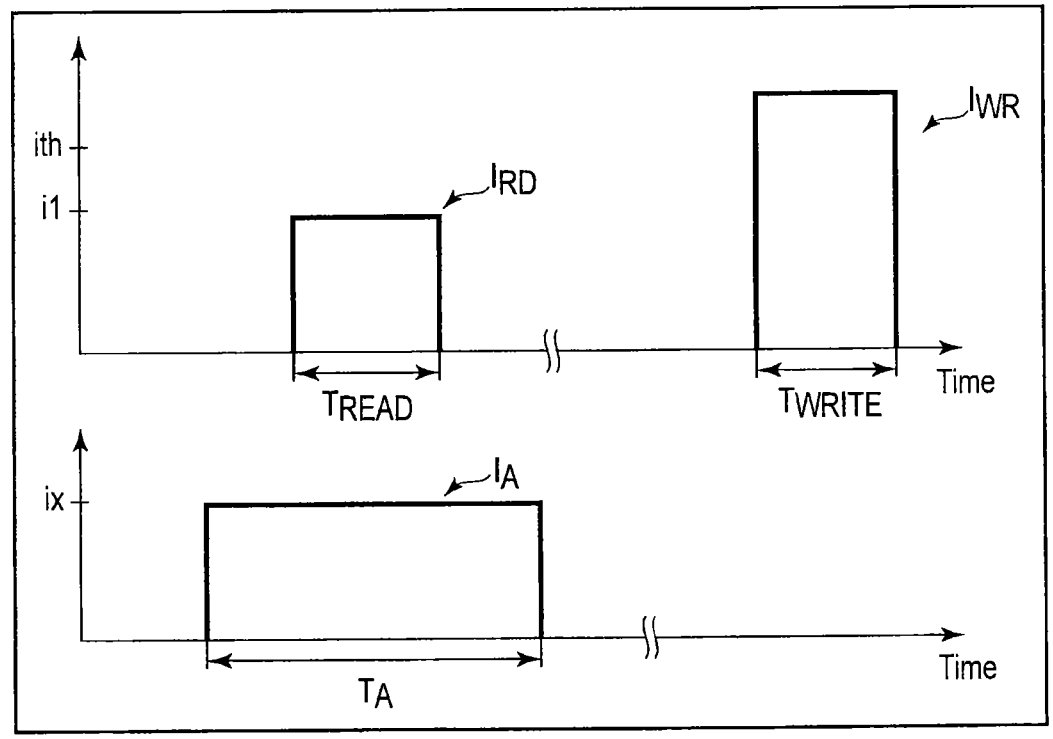

FIG. 11 shows the magnetic field generation current having a pulse shape different from the example shown in FIG. 10. As shown in FIG. 11, supply of the magnetic field generation current $I_A$ starts before the start of supply of the read current $I_{RD}$. Supply of the magnetic field generation current $I_A$ stops after the stop of supply of the read current $I_{RD}$.

As shown in FIG. 11, the rise time of the magnetic field generation current $I_A$ is set before the rise time of the read current $I_{RD}$, and the fall time of the magnetic field generation current $I_A$ is set after the fall time of the read current $I_{RD}$.

As shown in FIG. 11, when the write current $I_{WR}$ is supplied to the MTJ element 1Z, the magnetic field generation current $I_A$ is not supplied to the magnetic field application layer 20 even if the read current $I_{RD}$ and the magnetic field generation current $I_A$ have different pulse shapes (different generation timings).

Even when the magnetic field generation current having the pulse shape shown in FIG. 11 is used, it is possible to suppress unintended magnetization reversal of the storage layer 10 when discriminating the resistance state of the MTJ element 1Z and prevent an increase in the write current $I_{WR}$ caused by the magnetic field of the magnetic field application layer 20 when reversing the magnetization of the storage layer 10 of the MTJ element 1Z as in the case in which the magnetic field generation current shown in FIG. 10 is used.

When the period (pulse width) of supply of the magnetic field generation current $I_A$ is set to be longer than the period the read current $I_{RD}$ is supplied, as shown in FIG. 11, the effect of suppressing the precession of the spin of the storage layer is enhanced.

When the write current $I_{WR}$ is supplied to the MTJ element 1Z, no magnetic field is generated from the magnetic field application layer 20. Hence, the magnetic field MF1 applied to the storage layer 10 when discriminating the resistance state of the MTJ element 1Z is larger than the magnetic field applied to the storage layer 10 when reversing the magnetization of the storage layer 10 of the MTJ element 1Z.

As described above, when discriminating the resistance state of the MTJ element 1Z according to this embodiment (at the time of data read), the in-plane magnetic field applied from the magnetic field application layer 20 to the storage layer 10 having a perpendicular magnetization can suppress unintended magnetization reversal of the storage layer 10 (the read disturbance of the MTJ element). In addition, when reversing the magnetization of the storage layer 10 of the MTJ element 1Z (at the time of data write), the magnetization of the storage layer 10 can be reversed without any adverse effect (for example, an increase in the write current) of the magnetic field of the magnetic field application layer 20 because no current is supplied to the magnetic field application layer 20.

Note that the magnetic field application layer need not always be arranged under the storage layer 10 if it can apply an in-plane magnetic field to the storage layer.

As described above, according to the magnetoresistive element of the second embodiment as well, an operation error of the magnetoresistive element can be suppressed, like the magnetoresistive element of the first embodiment.

(3) Application Example

An application example of the magnetoresistive element according to each embodiment will be described with reference to FIGS. 12, 13, 14, and 15. Note that the same reference numerals as in the above-described embodiment denote almost the same components, and a description thereof will be made as needed.

(a) Application Example 1

An application example of the magnetoresistive element of the first embodiment will be described with reference to FIGS. 12 and 13.

The magnetoresistive element of the above-described first embodiment is used as a memory element of a magnetic memory, for example, an MRAM (Magnetoresistive Random Access Memory). In this application example, an STT MRAM (Spin-torque transfer MRAM) will be exemplified.

Figure 12:
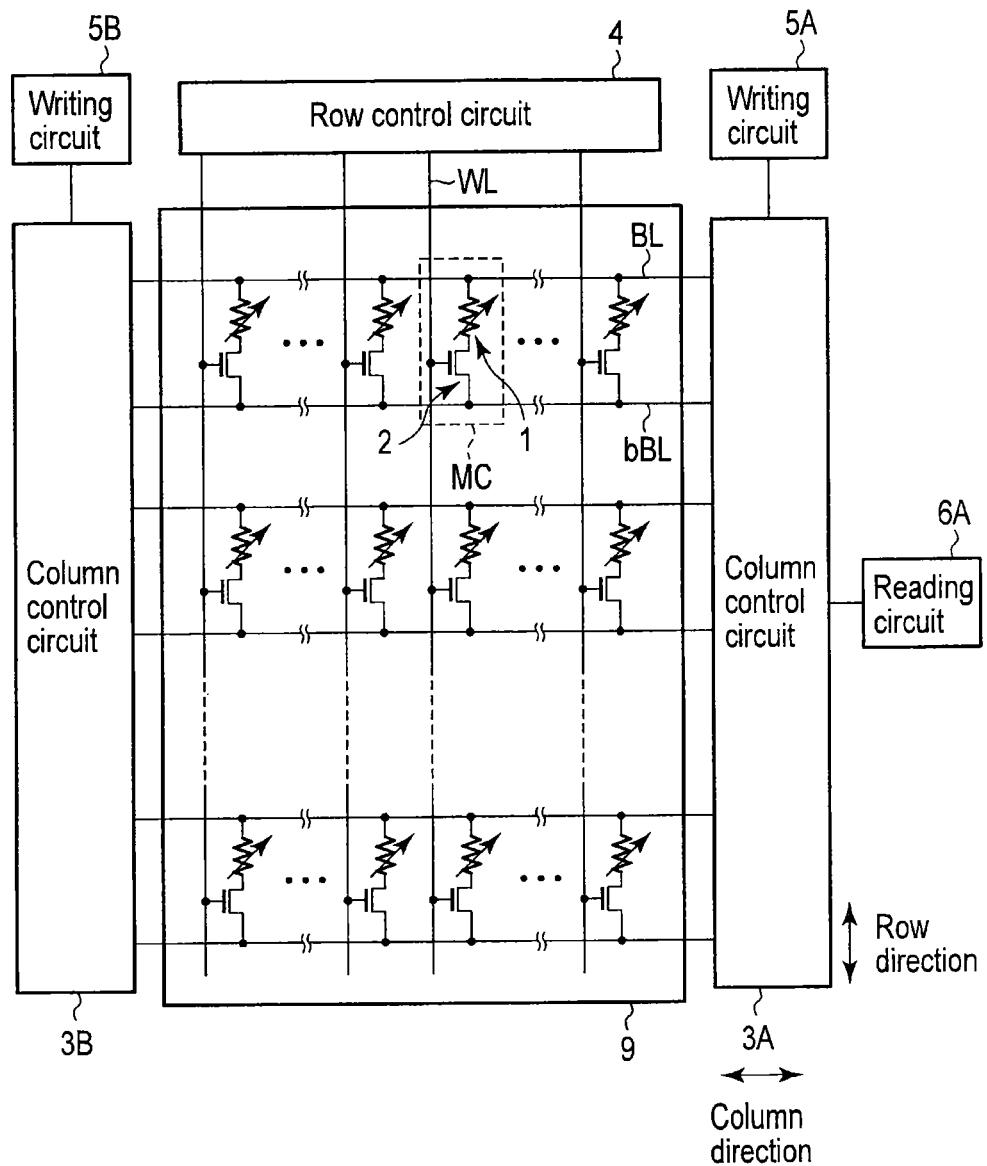
FIGS. 12 and 13 are views showing an application example of the magnetoresistive element according to the first embodiment.

FIG. 12 is a block diagram showing a memory cell array of an MRAM of Application Example 1 and a circuit arrangement in the vicinity thereof.

As shown in FIG. 12, a memory cell array 9 includes a plurality of memory cells MC.

The plurality of memory cells MC are arranged as an array in the memory cell array 9. A plurality of bit lines BL and bBL and a plurality of word lines WL are provided in the memory cell array 9. The bit lines BL and bBL run in the column direction. The word lines WL run in the row direction. The two bit lines BL and bBL form a bit line pair.

The memory cells MC are connected to the bit lines BL and bBL and the word lines WL.

The plurality of memory cells MC arrayed in the column direction are connected to the common pair of bit lines BL and bBL. The plurality of memory cells MC arrayed in the row direction are connected to the common word line WL.

Each memory cell MC includes, for example, one magnetoresistive element (MTJ element) 1 and one select switch 2. The magnetoresistive element (MTJ element) 1 described in the first embodiment is used as the MTJ element 1 in the memory cell MC.

The select switch 2 is, for example, a field effect transistor. The field effect transistor serving as the select switch 2 will be referred to as the select transistor 2 hereinafter.

The MTJ element 1 has one terminal connected to the bit line BL and the other terminal connected to one end (source/drain) of the current path of the select transistor 2. The other end (drain/source) of the current path of the select transistor 2 is connected to the bit line bBL. The control terminal (gate) of the select transistor 2 is connected to the word line WL.

One end of each word line WL is connected to a row control circuit 4. The row control circuit 4 controls activation/inactivation of the word lines based on an external address signal.

Column control circuits 3A and 3B are connected to one end and the other end of each of the bit lines BL and bBL. The column control circuits 3A and 3B control activation/inactivation of the bit lines BL and bBL based on an external address signal.

Writing circuits 5A and 5B are connected to one end and the other end of each of the bit lines BL and bBL via the column control circuits 3A and 3B. The writing circuits 5A and 5B include a source circuit such as a current source or voltage source to generate a write current and a sink circuit to absorb the write current, respectively.

In the STT MRAM, at the time of data write, the writing circuits 5A and 5B supply a write current to an externally selected memory cell (to be referred to as a selected cell hereinafter).

When writing data to the MTJ element 1, the writing circuits 5A and 5B bidirectionally supply a write current to the MTJ element 1 in the memory cell MC in accordance with data to be written to the selected cell. That is, the writing circuits 5A and 5B output a write current from the bit line BL to the bit line bBL or a write current from the bit line bBL to the bit line BL in accordance with data to be written to the MTJ element 1.

A reading circuit 6A is connected to one end of each of the bit lines BL and bBL via the column control circuit 3A. The reading circuit 6A includes a current source or voltage source to generate a read current, a sense amplifier that detects and amplifies a read signal, and a latch circuit for temporarily holding data. When reading data from the MTJ element 1, the reading circuit 6A supplies a read current to the selected cell. The current value of the read current is smaller than the current value (magnetization reversal threshold) of the write current so the magnetization of the storage layer is not reversed by the read current.

The current value or potential of the read node changes depending on the magnitude of the resistance value of the MTJ element 1 to which the read current is supplied. Data stored in the MTJ element 1 is discriminated based on a variation amount (read signal, read output) corresponding to the magnitude of the resistance value.

In the example shown in FIG. 12, the reading circuit 6A is provided on one end side in the column direction. However, two reading circuits may be provided at one end and the other end, respectively.

For example, circuits (to be referred to as peripheral circuits hereinafter) other than the row/column control circuits, the writing circuits, and the reading circuit are provided in the same chip as that of the memory cell array 9. For example, a buffer circuit, a state machine (control circuit), or an ECC (Error Checking and Correcting) circuit may be provided in the chip as a peripheral circuit.

Figure 13:
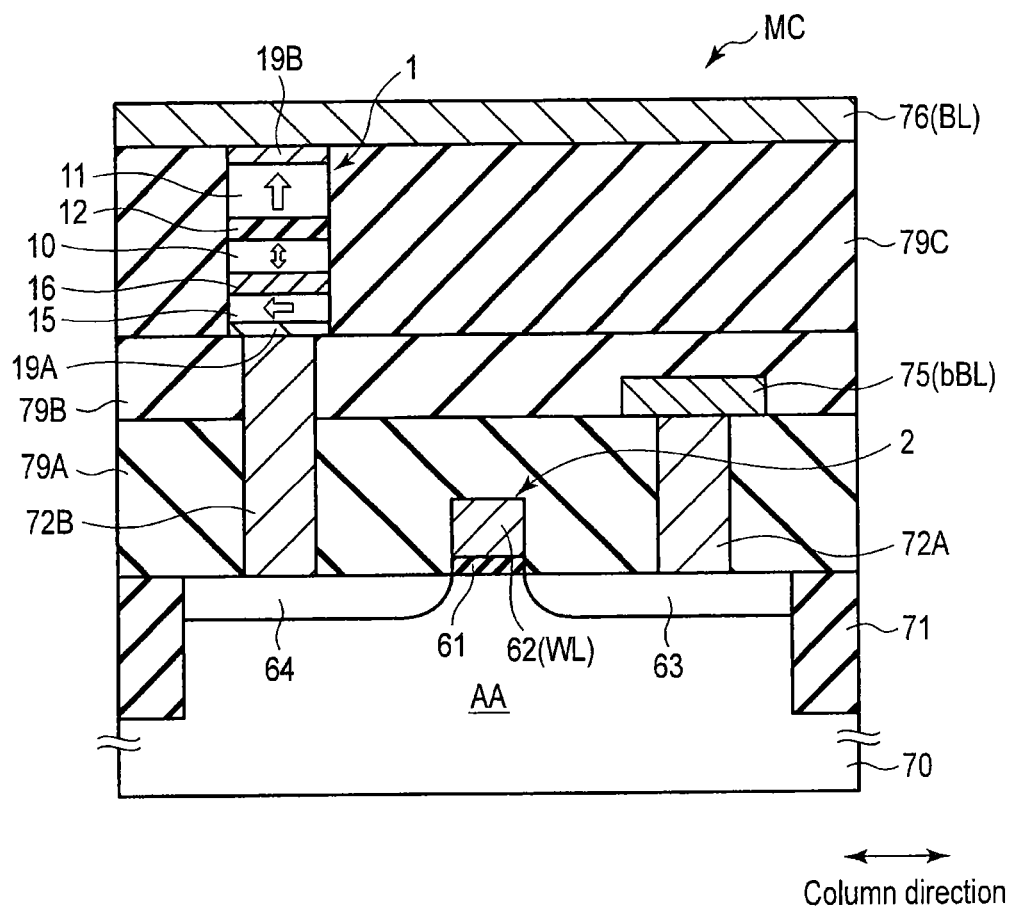

FIG. 13 is a sectional view showing an example of the structure of the memory cell MC provided in the memory cell array 9 of the MRAM of Application Example 1.

The memory cell MC is formed in an active region AA of a semiconductor substrate 70. The active region AA is defined by an insulating film 71 buried in the element isolation region of the semiconductor substrate 70. Interlayer dielectric films 79A, 79B and 79C are provided on the semiconductor substrate 70. The MTJ element 1 is provided on the dielectric film 79A, 79B as the substrate.

The upper end of the MTJ element 1 is connected to a bit line 76 (BL) via an upper electrode 19B. The bit line 76 is provided on the interlayer dielectric film 79C covering the MTJ element 1. The lower end of the MTJ element 1 is connected to a source/drain diffusion layer 64 of the select transistor 2 via a lower electrode 19A and a contact plug 72B in the interlayer dielectric film 79A, 79B. A source/drain diffusion layer 63 of the select transistor 2 is connected to a bit line 75 (bBL) via a contact plug 72A in the interlayer dielectric film 79A.

A gate electrode 62 is formed on a gate insulating film 61 on the surface of the active region AA between the source/drain diffusion layer 64 and the source/drain diffusion layer 63. The gate electrode 62 runs in the row direction and is used as the word line WL.

The MTJ element 1 is formed immediately above the contact plug 72B. However, it may be arranged at a position (for example, above the gate electrode of the select transistor) shifted from immediately above the contact plug using an intermediate interconnection layer.

FIG. 13 illustrates an example in which one memory cell is provided in one active region AA. However, two memory cells may be provided in one active region AA so as to be adjacent in the column direction while sharing one bit line bBL and the source/drain diffusion layer 63. The cell size of the memory cell MC is thus reduced.

FIG. 13 shows a field effect transistor having a planar structure as the select transistor 2. However, the structure of the field effect transistor is not limited to this. For example, a field effect transistor having a 3D structure such as an RCAT (Recess Channel Array Transistor) or Fin FET may be used as the select transistor. In the RCAT, the gate electrode is buried on a gate insulating film in a trench (recess) in a semiconductor region. In the Fin FET, the gate electrode and a strip-shaped semiconductor region (fin) cross each other on different levels while sandwiching a gate insulating film between them.

The MTJ element 1 of the first embodiment is used as a memory element of the MRAM. The MTJ element 1 in the memory cell MC includes the magnetic field application layer 15 having an in-plane magnetization film between the lower electrode 19A and the storage layer 10. When the read current $I_{RD}$ is supplied from the reading circuit 6A to the memory cell MC selected as a data read target, the read current $I_{RD}$ flows to the storage layer 10 and the reference layer 11 of the MTJ element, and also flows to the magnetic field application layer 15.

As described above with reference to FIG. 1, when the read current $I_{RD}$ is supplied, the in-plane magnetization film of the magnetic field application layer 15 has the magnetization M1. The magnetic field MF1 having a magnitude corresponding to the magnetization M1 of the in-plane magnetization film of the magnetic field application layer 15 is applied to the storage layer 10. The magnetic field (in-plane magnetic field) MF1 applied from the magnetic field application layer 15 to the storage layer 10 has a direction parallel to the film surface of the storage layer 10 near the storage layer 10.

At the time of data read from the MTJ element 1 serving as a memory element, the in-plane magnetic field applied to the storage layer 10 having a perpendicular magnetization suppresses the precession of the spin of the storage layer 10.

Hence, at the time of data read of the MRAM including the MTJ element 1 according to the embodiment, the magnetization reversal of the storage layer 10 of the MTJ element 1, that is, the read disturbance is suppressed. A large read signal using the relatively large read current $I_{RD}$ can thus be generated, and data can quickly be read from the MTJ element serving as a memory element.

When supplying the write current $I_{WR}$, the magnetization of the in-plane magnetization film of the magnetic field application layer 15 decreases or becomes almost zero due to the write current $I_{WR}$, which is larger than the read current $I_{RD}$, or the Joule heat generated by the write current $I_{WR}$.

For this reason, at the time of data write to the MTJ element 1 serving as a memory element, the spin of the storage layer 10 performs precession without being affected by the magnetic field from the magnetic field application layer 15. It is therefore possible to write data to the MTJ element 1 serving as a memory element using the write current $I_{WR}$ having a magnitude that is independent of the in-plane magnetic field almost without any influence of the magnetic field from the magnetic field application layer 15.

As described above, the magnetic memory including the magnetoresistive element of the first embodiment in the memory cell can suppress a read disturbance.

Additionally, the magnetic memory including the magnetoresistive element of the first embodiment in the memory cell can suppress an increase in the power consumption of the memory because the write current $I_{WR}$ does not increase due to a suppression of as the read disturbance.

Hence, the magnetic memory including the magnetoresistive element of the first embodiment can suppress an operation error of the memory element and the memory.

(b) Application Example 2

A magnetic memory (for example, MRAM) as an application example of the magnetoresistive element of the second embodiment will be described with reference to FIGS. 14 and 15. Note that a description of almost the same components as in the magnetic memory of Application Example 1 will be made as needed.

FIG. 14 is a block diagram showing a memory cell array of an MRAM of Application Example 2 including an MTJ element 1Z of the second embodiment and a circuit arrangement in the vicinity thereof.

As shown in FIG. 14, the MRAM of Application Example 2 includes a plurality of magnetic field generation lines (to be also referred to as read assist lines hereinafter) RAL serving as a magnetic field application layer 20, and a magnetic field generation control circuit (to be also referred to as a read assist circuit hereinafter) 7 that drives the magnetic field generation lines RAL.

Each magnetic field generation line RAL runs in, for example, the row direction. One end of each magnetic field generation line RAL is connected to a current source (or voltage source) 70. The other end of the magnetic field generation line RAL is grounded. A current flowing to the magnetic field generation line RAL flows in one direction.

The magnetic field generation control circuit 7 controls current supply to the magnetic field generation lines RAL. At the time of data read, the magnetic field generation control circuit 7 electrically connects the current sources 70 to the magnetic field generation lines RAL. At the time of data write, the magnetic field generation control circuit 7 electrically disconnects the current sources 70 from the magnetic field generation lines RAL.

Figure 15:
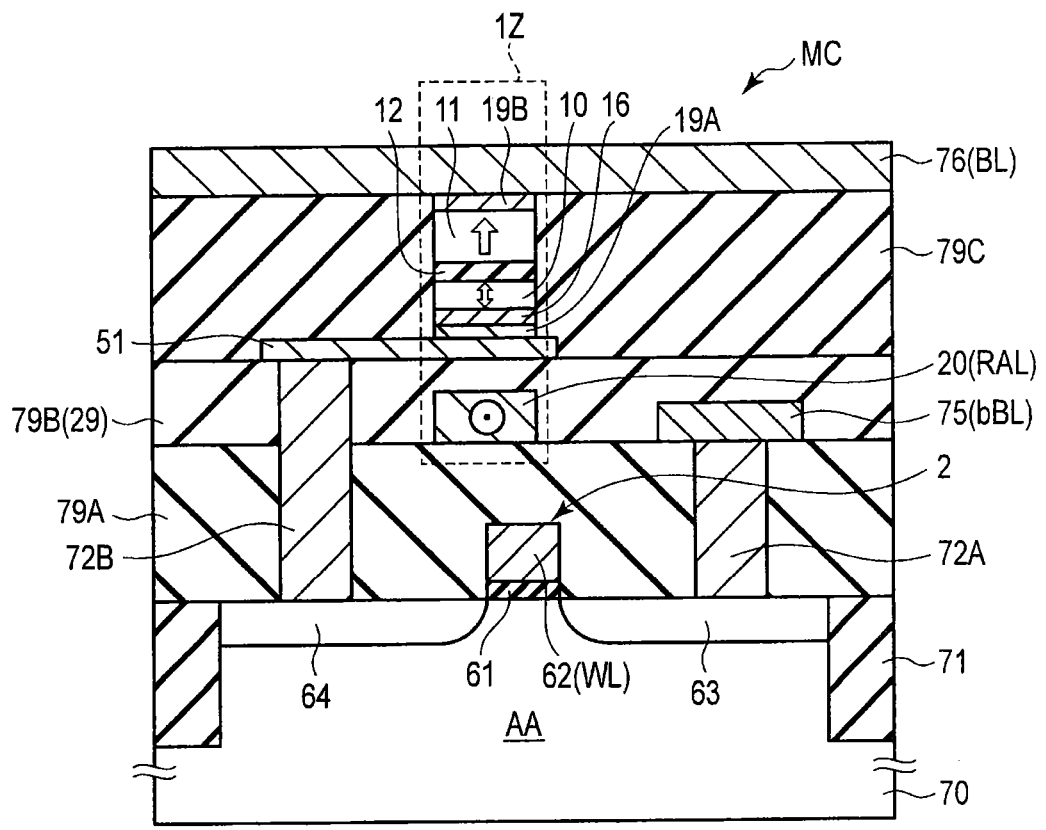

FIG. 15 is a sectional view showing an example of the structure of a memory cell MC provided in the memory cell array of the MRAM of Application Example 2.

The MTJ element 1Z of the second embodiment is provided at a position shifted from immediately above a contact plug 72B, for example, above a gate electrode 62 of a select transistor 2 via a lead line 51.

The magnetic field generation line RAL serving as the magnetic field application layer 20 is provided in the interlayer dielectric film 79B. The magnetic field generation line RAL is provided under a storage layer 10 of the MTJ element 1Z while sandwiching the interlayer dielectric film 79B serving as an insulating layer 29. The magnetic field generation line RAL is provided, for example, at the same interconnection level as that of an intermediate line 75 connected to a second bit line bBL.

As described above with reference to FIGS. 10 and 11, at the time of data read, the magnetic field generation control circuit 7 shown in FIG. 14 connects the magnetic field generation line RAL to the current source 70 to supply a magnetic field generation current (read assist current) $I_A$ having a predetermined pulse shape to the magnetic field generation line RAL.

A magnetic field MF1 is thus generated by the current $I_A$ flowing to the magnetic field generation line RAL, as shown in (a) of FIG. 8. The magnetic field MF1 applied from the magnetic field generation line RAL to the storage layer 10 is set to be parallel to the film surface of the storage layer 10.

In the state in which the magnetic field parallel to the film surface of the storage layer 10 is applied from the magnetic field generation line RAL to the storage layer 10 of the MTJ element 1Z or at the same time as the application, the read current $I_{RD}$ is supplied to the MTJ element 1Z via the transistor 2. The in-plane magnetic field from the magnetic field generation line RAL suppresses the precession of the spin of the MTJ element 1Z to which the read current $I_{RD}$ is supplied.

For this reason, at the time of data read of the MRAM including the MTJ element 1Z of the second embodiment, the read disturbance of the MTJ element 1Z is suppressed.

At the time of data write, the magnetic field generation control circuit 7 electrically disconnects the magnetic field generation line RAL from the current source 70, as shown in (b) of FIG. 8. Hence, the current $I_A$ does not flow to the magnetic field generation line RAL at the time of data write, and the magnetic field MF1 is hardly generated by the current flowing to the magnetic field generation line RAL, as described with reference to FIGS. 8, 10, and 11.

For this reason, the magnetic field generation line RAL does not adversely affect the magnetization reversal of the storage layer 10 of the MTJ element 1Z by STT at the time of data write to the MRAM including the MTJ element 1Z of the second embodiment.

As described above, the magnetic memory including the MTJ element 1Z of the second embodiment can suppress a read disturbance without increasing the write current (magnetization reversal current or magnetization reversal threshold), like the magnetic memory including the MTJ element of the first embodiment.

Hence, the magnetic memory including the magnetoresistive element of the second embodiment can suppress an operation error of the memory element and the memory.

Other Embodiments

The magnetoresistive element according to the first or second embodiment may be applied to a magnetic memory other than an MRAM. A magnetic memory using the magnetoresistive element according to the first or second embodiment is used, for example, as an alternative to memories such as DRAM and SRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a memory cell including a magnetoresistive element, the magnetoresistive element comprising a first magnetic film having a magnetization perpendicular to a film surface and a variable magnetization direction, a second magnetic film having a magnetization perpendicular to the film surface and an invariable magnetization direction, a first nonmagnetic film between the first magnetic film and the second magnetic film, a magnetic field application layer including a third magnetic film provided on the first magnetic film opposite to a side of the first nonmagnetic film, the third magnetic film having a magnetization parallel to the film surface and applying a magnetic field to the first magnetic film, the magnetic field being parallel to the film surface of the first magnetic film; and an intermediate layer provided between the first magnetic film and the magnetic field application layer;
a writing circuit supplying a write current to the memory cell to write data to the memory cell, the write current flowing into the first magnetic film, the second magnetic film and the magnetic field application layer;
a reading circuit supplying a read current to the memory cell to read data stored in the memory cell, the read current flowing into the first magnetic film, the second magnetic film and the magnetic field application layer, a magnitude of the read current less than a magnitude of the write current;
wherein a magnitude of the magnetization of the third magnetic film when the read current flows into the magnetic field application layer is larger than the magnitude of the magnetization of the third magnetic film when the write current flows into the magnetic field application layer.

2. The memory according to claim 1, wherein the magnetic field applied from the third magnetic film to the first magnetic film when the read current flows into the magnetic field application layer is larger than the magnetic field applied from the third magnetic film to the first magnetic film when the write current flows into the magnetic field application layer.

3. The memory according to claim 1, wherein the magnitude of the magnetization of the third magnetic film changes depending on the magnitudes of the write current and read current flowing into the magnetic field application layer.

4. The memory according to claim 3, wherein the magnetic field application layer includes a second nonmagnetic film provided on the third magnetic film opposite to a side of the intermediate layer and having a resistance value smaller than that of the first nonmagnetic film.

5. The memory according to claim 4, wherein the third magnetic film includes FePd, and the second nonmagnetic film includes MgO.

6. The memory according to claim 5, wherein an atomic concentration of Fe is higher than an atomic concentration of Pd in the FePd film.

7. The memory according to claim 5, wherein
the first nonmagnetic film includes MgO, and
a film thickness of the second nonmagnetic film is smaller than a film thickness of the first nonmagnetic film.

8. The memory according to claim 4, wherein the third magnetic film comprises an artificial lattice of FePd and MgO.

9. The memory according to claim 1, wherein the third magnetic film comprises a ferrimagnetic film, and the magnitude of the magnetization of the third magnetic film changes depending on a magnitude of heat applied to the third magnetic film.

10. The memory according to claim 9, wherein the magnetic field application layer includes a resistive film provided on the third magnetic film opposite to a side of the intermediate layer so as to generate heat by the write current.

11. The memory according to claim 10, wherein the resistive film includes a third nonmagnetic film having a resistance value smaller than that of the first nonmagnetic film.

12. The memory according to claim 11, wherein
each of the first nonmagnetic film and the third nonmagnetic film includes MgO, and
a film thickness of the third nonmagnetic film is smaller than a film thickness of the first nonmagnetic film.

13. The memory according to claim 9, wherein when supplying the write current, heat substantially corresponding to a compensation temperature of the ferrimagnetic film is applied to the third magnetic film.

14. A magnetic memory comprising:
a memory cell including a magnetoresistive element, the magnetoresistive element comprising a first magnetic film having a magnetization perpendicular to a film surface and a variable magnetization direction, a second magnetic film having a magnetization perpendicular to the film surface and an invariable magnetization direction, a nonmagnetic film between the first magnetic film and the second magnetic film, a magnetic field application layer provided on the first magnetic film opposite to a side of the nonmagnetic film so as to apply a magnetic field to the first magnetic film, the magnetic field being parallel to the film surface of the first magnetic film, and an insulating layer provided between the first magnetic film and the magnetic field application layer so as to electrically isolate the first magnetic film and the magnetic field application layer from each other;
a writing circuit supplying a write current to the memory cell to write data to the memory cell, the write current flowing into the first magnetic film and the second magnetic film;
a reading circuit supplying a read current to the memory cell to read data stored in the memory cell, the read current flowing into the first magnetic film and the second magnetic film; and
a magnetic field generation circuit supplying a first current to the memory cell to generate a magnetic field, the first current flowing into the magnetic field application layer,
wherein when the read current is supplied to the memory cell, the magnetic field generated by the first current is applied to the first magnetic film, and
when a write current is supplied to the memory cell, the first current does not flow into the magnetic field application layer.

15. The memory according to claim 14, wherein the magnetic field application layer comprises a nonmagnetic conductor.

16. The memory according to claim 14, wherein the magnetic field application layer includes a yoke member provided on a surface except a surface facing the first magnetic film.

17. The memory according to claim 14, wherein the magnetic field application layer is provided at a position overlapping the first magnetic film in a direction perpendicular to the film surface of the first magnetic film.

18. The memory according to claim 14, wherein a pulse width of the first current is larger than a pulse width of the read current.

* * * * *